US011881129B2

(12) United States Patent
Price et al.

(10) Patent No.: US 11,881,129 B2
(45) Date of Patent: Jan. 23, 2024

(54) SYSTEMS AND METHODS FOR ADDING PERSISTENCE TO SINGLE PHOTON AVALANCHE DIODE IMAGERY

(71) Applicant: Microsoft Technology Licensing, LLC, Redmond, WA (US)

(72) Inventors: Raymond Kirk Price, Redmond, WA (US); Michael Bleyer, Seattle, WA (US); Christopher Douglas Edmonds, Carnation, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 351 days.

(21) Appl. No.: 17/246,516

(22) Filed: Apr. 30, 2021

(65) Prior Publication Data

US 2022/0351650 A1 Nov. 3, 2022

(51) Int. Cl.
| | |
|---|---|
| G08B 5/22 | (2006.01) |
| G09F 9/33 | (2006.01) |
| G06T 7/207 | (2017.01) |
| G06T 7/70 | (2017.01) |
| G06V 10/25 | (2022.01) |

(Continued)

(52) U.S. Cl.
CPC ............... *G09F 9/33* (2013.01); *G06T 7/207* (2017.01); *G06T 7/70* (2017.01); *G06V 10/25* (2022.01); *G06V 10/7557* (2022.01); *H01L 31/107* (2013.01); *G09G 2320/06* (2013.01)

(58) Field of Classification Search
CPC .. G09F 9/33; G06T 7/207; G06T 7/70; G06V 10/25; G06V 10/7557; H01L 31/107; G09G 2320/06; H04N 23/743; H04N 5/2621; H04N 23/6812; H04N 23/6845; H04N 23/741; H04N 23/951; H04N 5/265; G02B 27/0093
USPC .............. 340/815.45, 815.4, 815.41, 815.43, 340/815.49
See application file for complete search history.

(56) References Cited

U.S. PATENT DOCUMENTS

| | | | |
|---|---|---|---|
| 11,114,488 B1 * | 9/2021 | Lu ..................... | H01L 27/14609 |
| 11,236,993 B1 * | 2/2022 | Hall ..................... | G02B 27/017 |
| 2008/0187234 A1 | 8/2008 | Watanabe et al. | |

(Continued)

FOREIGN PATENT DOCUMENTS

WO    2019226908 A1    11/2019

OTHER PUBLICATIONS

"International Search Report and Written Opinion Issued in PCT Application No. PCT/US2022/017839", dated May 30, 2022, 15 Pages.

*Primary Examiner* — Anh V La
(74) *Attorney, Agent, or Firm* — Workman Nydegger

(57) ABSTRACT

A system for adding persistence to SPAD imagery is configurable to capture, using a SPAD array, a plurality of image frames. The system is configurable to capture, using an IMU, pose data associated with the plurality of image frames. The pose data includes at least respective pose data associated with each of the plurality of image frames. The system is configurable to determine a persistence term based on the pose data. The system is also configurable to generate a composite image based on the plurality of image frames, the respective pose data associated with each of the plurality of image frames, and the persistence term. The persistence term defines a contribution of each of the plurality of image frames to the composite image.

21 Claims, 24 Drawing Sheets

(51) Int. Cl.
    *G06V 10/75*       (2022.01)
    *H01L 31/107*     (2006.01)

(56) References Cited

U.S. PATENT DOCUMENTS

| | | |
|---|---|---|
| 2012/0200744 A1 | 8/2012 | Matsuoka |
| 2013/0241955 A1 | 9/2013 | Tamaru et al. |
| 2017/0343823 A1 | 11/2017 | Tagawa et al. |
| 2018/0035037 A1 | 2/2018 | Shioya |
| 2018/0103528 A1* | 4/2018 | Moore .................. G01S 7/484 |
| 2020/0280670 A1 | 9/2020 | Hsieh et al. |
| 2021/0319606 A1* | 10/2021 | Gupta .................. G06T 3/0093 |

* cited by examiner

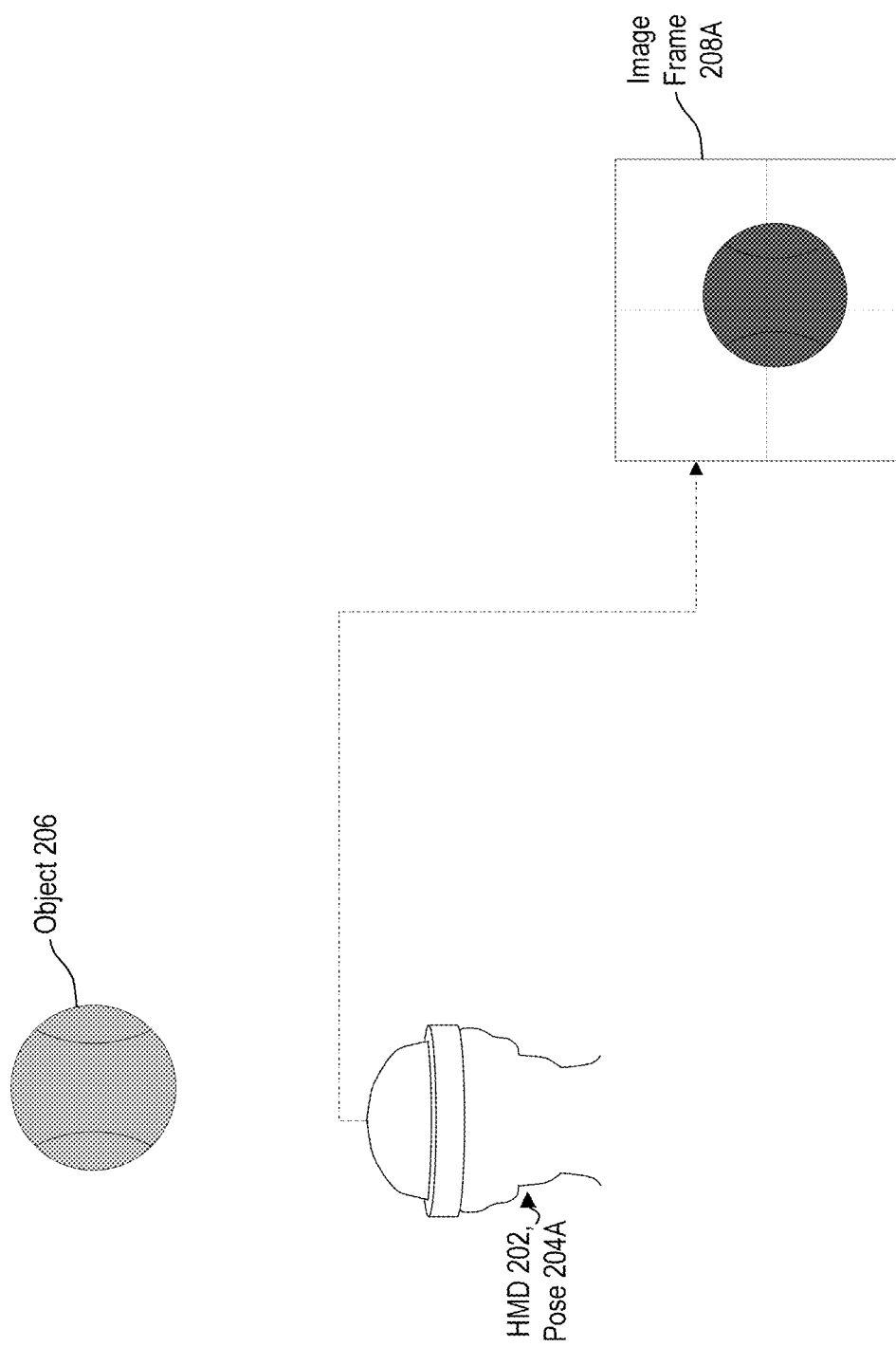

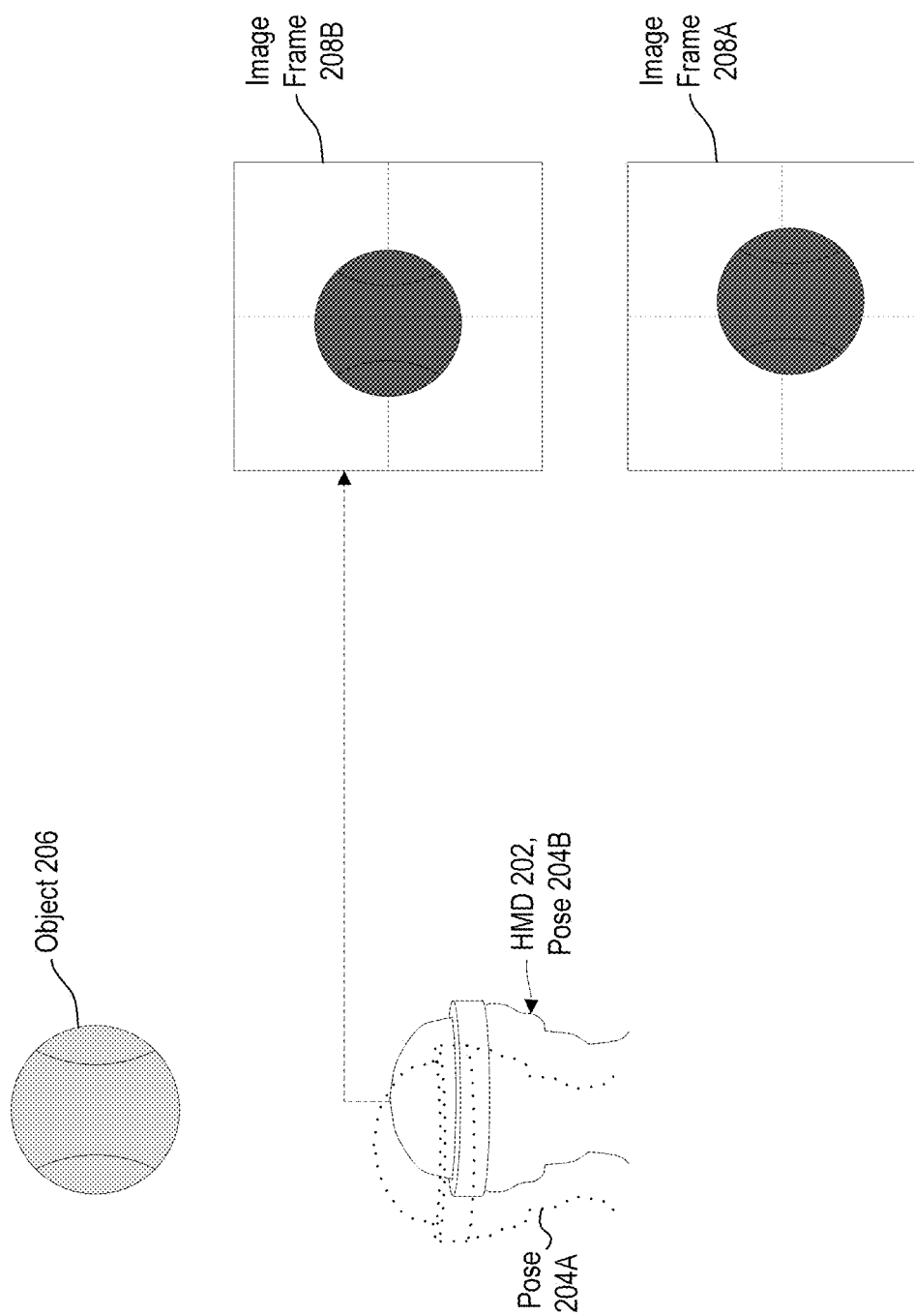

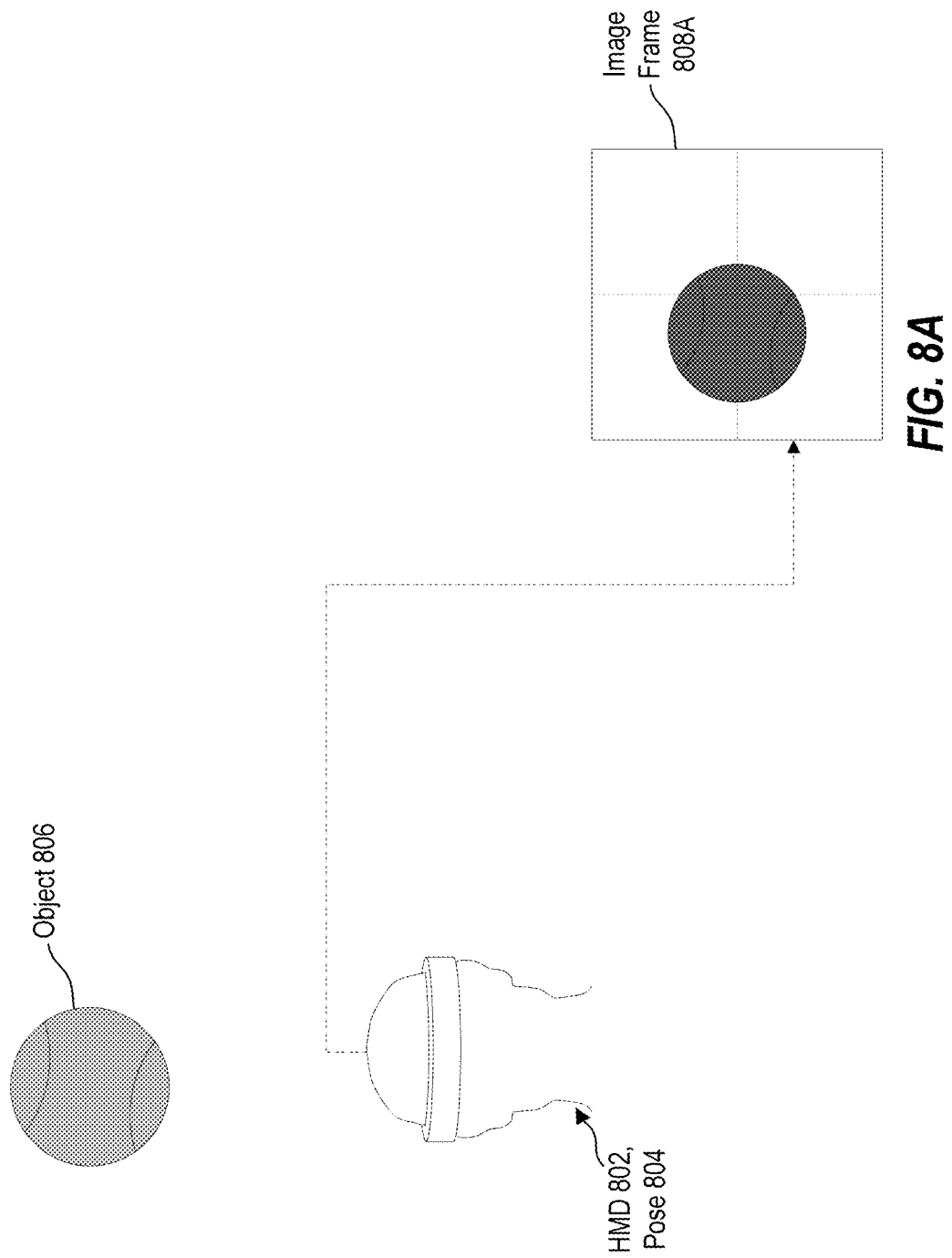

2000

2002
Capturing, Using The SPAD Array, An Image Frame

2004
Capturing, Using The IMU, Pose Data Associated With The Capturing Of The Image Frame

2006
Accessing A Persistence Frame, The Persistence Frame Comprising A Preceding Composite Image Frame Generated Based On At Least One Preceding Image Frame, The At Least One Preceding Image Frame Being Associated With One Or More Timepoints That Precede A Capture Timepoint Associated With The Image Frame

2008
Generating A Persistence Term Based On (i) The Pose Data Associated With The Capturing Of The Image Frame, (ii) A Similarity Comparison Based On The Image Frame And The Persistence Frame, Or (iii) A Signal Strength Associated With The Image Frame

2010
Generating A Composite Image Based On The Image Frame, The Persistence Frame, And The Persistence Term, Wherein The Persistence Term Defines A Contribution Of The Image Frame And The Persistence Frame To The Composite Image

2012
Displaying The Composite Image On The Display

2014
Capturing A Subsequent Image Frame At A Subsequent Timepoint That Is Subsequent To The Capture Timepoint Associated With The Image Frame

2016
Generating A Subsequent Composite Image Using A Subsequent Persistence Frame That Is Based On The Composite Image, The Subsequent Composite Image Being Based On The Subsequent Persistence Frame And The Subsequent Image Frame

*FIG. 20*

SYSTEMS AND METHODS FOR ADDING PERSISTENCE TO SINGLE PHOTON AVALANCHE DIODE IMAGERY

BACKGROUND

Mixed-reality (MR) systems, including virtual-reality and augmented-reality systems, have received significant attention because of their ability to create truly unique experiences for their users. For reference, conventional virtual-reality (VR) systems create a completely immersive experience by restricting their users' views to only a virtual environment. This is often achieved, in VR systems, through the use of a head-mounted device (HMD) that completely blocks any view of the real world. As a result, a user is entirely immersed within the virtual environment. In contrast, conventional augmented-reality (AR) systems create an augmented-reality experience by visually presenting virtual objects that are placed in or that interact with the real world.

As used herein, VR and AR systems are described and referenced interchangeably. Unless stated otherwise, the descriptions herein apply equally to all types of mixed-reality systems, which (as detailed above) includes AR systems, VR reality systems, and/or any other similar system capable of displaying virtual objects.

Some MR systems include one or more cameras for facilitating image capture, video capture, and/or other functions. For instances, cameras of an MR system may utilize images and/or depth information obtained using the camera(s) to provide pass-through views of a user's environment to the user. An MR system may provide pass-through views in various ways. For example, an MR system may present raw images captured by the camera(s) of the MR system to a user. In other instances, an MR system may modify and/or reproject captured image data to correspond to the perspective of a user's eye to generate pass-through views. An MR system may modify and/or reproject captured image data to generate a pass-through view using depth information for the captured environment obtained by the MR system (e.g., using a depth system of the MR system, such as a time-of-flight camera, a rangefinder, stereoscopic depth cameras, etc.). In some instances, an MR system utilizes one or more predefined depth values to generate pass-through views (e.g., by performing planar reprojection).

In some instances, pass-through views generated by modifying and/or reprojecting captured image data may at least partially correct for differences in perspective brought about by the physical separation between a user's eyes and the camera(s) of the MR system (known as the "parallax problem," "parallax error," or, simply "parallax"). Such pass-through views/images may be referred to as "parallax-corrected pass-through" views/images. By way of illustration, parallax-corrected pass-through images may appear to a user as though they were captured by cameras that are co-located with the user's eyes.

A pass-through view can aid users in avoiding disorientation and/or safety hazards when transitioning into and/or navigating within a mixed-reality environment. Pass-through views may also enhance user views in low visibility environments. For example, mixed-reality systems configured with long wavelength thermal imaging cameras may facilitate visibility in smoke, haze, fog, and/or dust. Likewise, mixed-reality systems configured with low light imaging cameras facilitate visibility in dark environments where the ambient light level is below the level required for human vision.

To facilitate imaging of an environment for generating a pass-through view, some MR systems include image sensors that utilize complementary metal-oxide-semiconductor (CMOS) and/or charge-coupled device (CCD) technology. For example, such technologies may include image sensing pixel arrays where each pixel is configured to generate electron-hole pairs in response to detected photons. The electrons may become stored in per-pixel capacitors, and the charge stored in the capacitors may be read out to provide image data (e.g., by converting the stored charge to a voltage).

However, such image sensors suffer from a number of shortcomings. For example, the signal to noise ratio for a conventional image sensor may be highly affected by read noise, especially when imaging under low visibility conditions. For instance, under low light imaging conditions (e.g., where ambient light is below about 10 lux, such as within a range of about 1 millilux or below), a CMOS or CCD imaging pixel may detect only a small number of photons, which may cause the read noise to approach or exceed the signal detected by the imaging pixel and decrease the signal-to-noise ratio.

The dominance of read noise in a signal detected by a CMOS or CCD image sensor is often exacerbated when imaging at a high frame rate under low light conditions. Although a lower framerate may be used to allow a CMOS or CCD sensor to detect enough photons to allow the signal to avoid being dominated by read noise, utilizing a low framerate often leads to motion blur in captured images. Motion blur is especially problematic when imaging is performed on an HMD or other device that undergoes regular motion during use.

In addition to affecting pass-through imaging, the read noise and/or motion blur associated with conventional image sensors may also affect other operations performed by HMDs, such as late stage reprojection, rolling shutter corrections, object tracking (e.g., hand tracking), surface reconstruction, semantic labeling, 3D reconstruction of objects, and/or others.

To address shortcomings associated with CMOS and/or CCD image sensors, devices have emerged that utilize single photon avalanche diode (SPAD) image sensors. In contrast with conventional CMOS or CCD sensors, a SPAD is operated at a bias voltage that enables the SPAD to detect a single photon. Upon detecting a single photon, an electron-hole pair is formed, and the electron is accelerated across a high electric field, causing avalanche multiplication (e.g., generating additional electron-hole pairs). Thus, each detected photon may trigger an avalanche event. A SPAD may operate in a gated manner (each gate corresponding to a separate shutter operation), where each gated shutter operation may be configured to result in a binary output. The binary output may comprise a "1" where an avalanche event was detected during an exposure (e.g., where a photon was detected), or a "0" where no avalanche event was detected.

Separate shutter operations may be integrated over a frame capture time period. The binary output of the shutter operations over a frame capture time period may be counted, and an intensity value may be calculated based on the counted binary output.

An array of SPADs may form an image sensor, with each SPAD forming a separate pixel in the SPAD array. To capture an image of an environment, each SPAD pixel may detect avalanche events and provide binary output for consecutive shutter operations in the manner described herein. The per-pixel binary output of multiple shutter operations over a frame capture time period may be counted, and per-pixel intensity values may be calculated based on the counted per-pixel binary output. The per-pixel intensity values may be used to form an intensity image of an environment.

Although SPAD sensors show promise for overcoming various shortcomings associated with CMOS or CCD sensors, implementing SPAD sensors for image and/or video capture is still associated with many challenges. For example, there is an ongoing need and desire for improvements to the image quality of SPAD imagery captured under low light conditions. Furthermore, there is an ongoing need and desire for solutions that provide such improvements in a computationally efficient manner.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments provide systems, methods and devices for adding persistence to single photon avalanche diode (SPAD) imagery.

Some embodiments provide a system that includes a SPAD array that has a plurality of SPAD pixels. The system also includes one or more processors and one or more hardware storage devices storing instructions that are executable by the one or more processors to configure the system to perform various acts. The acts include capturing, using the SPAD array, a plurality of image frames. The acts also include capturing, using the IMU, pose data associated with the plurality of image frames. The pose data includes at least respective pose data associated with each of the plurality of image frames. The acts also include determining a persistence term based on the pose data. Furthermore, the acts also include generating a composite image based on the plurality of image frames, the respective pose data associated with each of the plurality of image frames, and the persistence term. The persistence term defines a contribution of each of the plurality of image frames to the composite image.

Some embodiments provide a system that includes one or more processors and one or more hardware storage devices storing instructions that are executable by the one or more processors to configure the system to perform various acts. The acts include accessing a plurality of sequentially captured image frames and accessing pose data associated with the plurality of sequentially captured image frames. The pose data includes at least respective pose data associated with each of the plurality of sequentially captured image frames. The acts also include generating a plurality of spatially aligned sequentially captured image frames by spatially aligning each of the plurality of sequentially captured image frames with one another using the pose data. The acts also include measuring a dissimilarity between at least a first image frame and at least a second image frame of the plurality of spatially aligned sequentially captured image frames. The second image frame is associated with a capture timepoint that is subsequent to a capture timepoint associated with the first image frame. The acts also include determining a persistence term based on the dissimilarity and generating a composite image based on the plurality of spatially aligned sequentially captured image frames and the persistence term. The persistence term defines a contribution of each of the plurality of spatially aligned sequentially captured image frames to the composite image.

In some embodiments, the acts include accessing a plurality of sequentially captured image frames and accessing pose data associated with the plurality of sequentially captured image frames. The pose data represents an amount of motion associated with a capturing of the plurality of sequentially captured image frames. The acts also include identifying a subset of image frames from the plurality of sequentially captured image frames. A number of image frames in the subset of image frames is determined based on the amount of motion represented by the pose data. The acts also include generating a composite image using the subset of image frames from the plurality of sequentially captured image frames while refraining from using one or more image frames of the plurality of sequentially captured image frames that are not included in the subset of image frames.

In some embodiments, the acts include accessing a plurality of sequentially captured image frames, where each image frame of the plurality of sequentially captured image frames is associated with a respective capture timepoint. The acts also include measuring a signal strength of at least a portion of a particular image frame of the plurality of sequentially captured image frames and determining a persistence term for the portion of the particular image frame based on the signal strength for the portion of the particular image frame. The acts also include generating a composite image based on the plurality of spatially aligned sequentially captured image frames and the persistence term. The persistence term defines a contribution of each of the plurality of sequentially captured image frames to the composite image.

Some embodiments include a system comprising a SPAD array that has a plurality of SPAD pixels. The system includes one or more processors and one or more hardware storage devices storing instructions that are executable by the one or more processors to configure the system to perform various acts. The system is configured to perform a plurality of sequential exposure and readout operations. Each exposure and readout operation includes (i) applying a set of shutter operations to configure each SPAD pixel of the SPAD array to enable photon detection, and (ii) for each SPAD pixel of the SPAD array, reading out a number of photons detected during the set of shutter operations. The system is also configured to generate an image based on the number of photons detected for each SPAD pixel during each of the plurality of sequential exposure and readout operations.

In some embodiments, the system is configured to perform a plurality of sequential shutter operations to configure each SPAD pixel of the SPAD array to enable photon detection. The system is also configurable to access a respective stream of binary counts for each SPAD pixel of the SPAD array. Each respective stream of binary counts indicates, for a respective SPAD pixel, a number of photons detected during the plurality of sequential shutter operations. The system is also configured to identify a set of binary counts from the respective streams of binary counts for each SPAD pixel. The set of binary counts includes a respective set of binary counts from each respective stream of binary counts for each SPAD pixel. The system is also configured to generate an image using the set of binary counts.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIGS. 2A-2C illustrate an example of capturing image frames from different poses using a single photon avalanche diode (SPAD) array of a head-mounted display (HMD);

FIGS. 8A-8C illustrate an example of capturing image frames of a moving object using a SPAD array of an HMD;

FIG. 20 illustrates an example flow diagram depicting acts associated with efficient generation of SPAD imagery with persistence.

DETAILED DESCRIPTION

Figure 1:
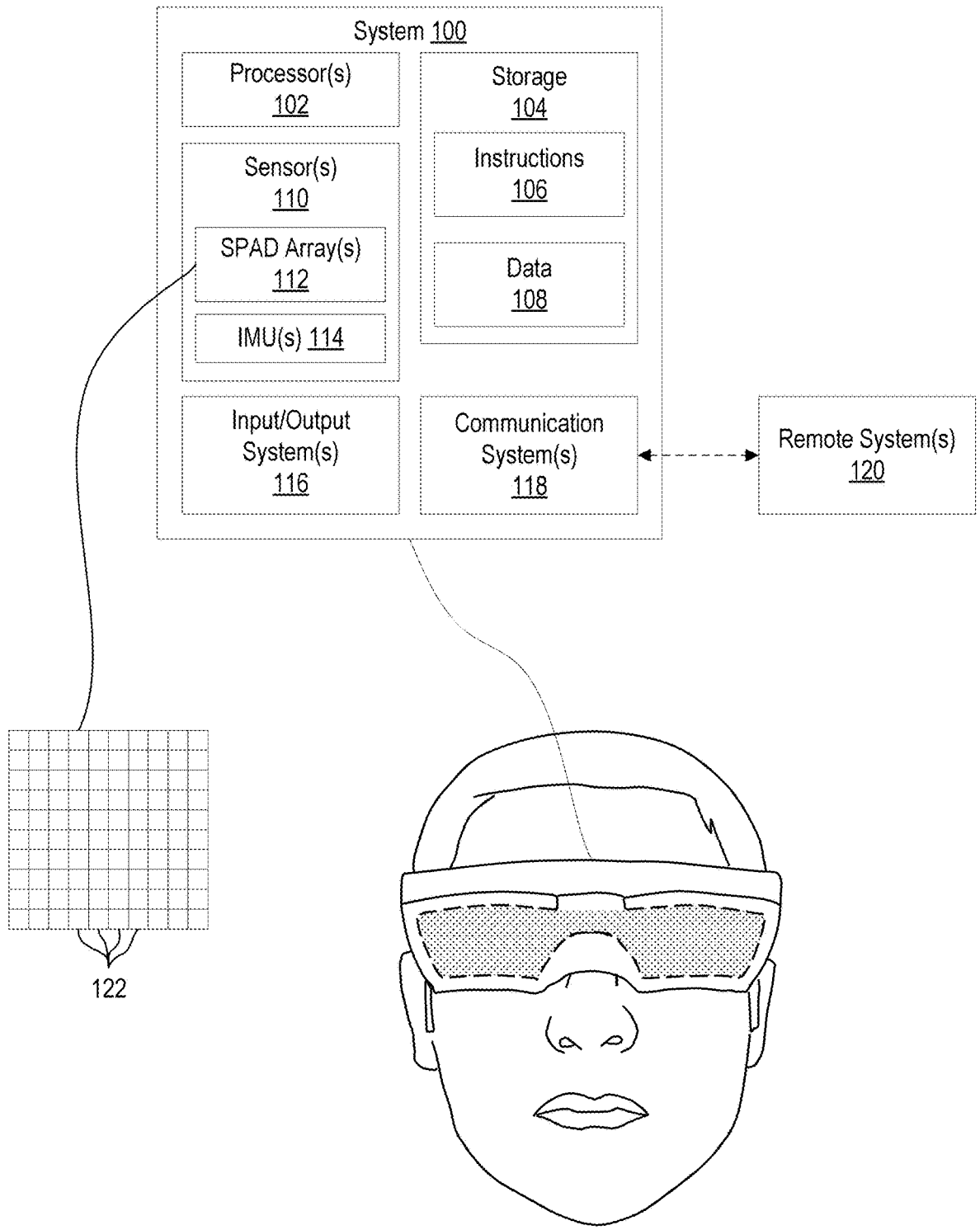
FIG. 1 illustrates example components of an example system that may include or be used to implement one or more disclosed embodiments.

Disclosed embodiments are generally directed to systems, methods, and devices for adding persistence to single photon avalanche (SPAD) imagery, and/or techniques for doing so in a computationally efficient manner.

Examples of Technical Benefits, Improvements, and Practical Applications

Those skilled in the art will recognize, in view of the present disclosure, that at least some of the disclosed embodiments may be implemented to address various shortcomings associated with at least some conventional image acquisition techniques. The following section outlines some example improvements and/or practical applications provided by the disclosed embodiments. It will be appreciated, however, that the following are examples only and that the embodiments described herein are in no way limited to the example improvements discussed herein.

The use of SPAD image sensors for image capture with persistence as described herein may provide a number of advantages over conventional systems and techniques for image capture, particularly for imaging under low light conditions and/or for imaging from devices that undergo motion during image capture (e.g., HMDs).

Initially, the binarization of the SPAD signal effectively eliminates read noise, thereby improving signal-to-noise ratio for SPAD image sensor arrays as compared with conventional CMOS and/or CCD sensors. Accordingly, because of the binarization of SPAD signal, a SPAD signal may be read out at a high framerate (e.g., 90 Hz or greater, such as 120 Hz or even 240 Hz) without causing the signal to be dominated by read noise, even for signals capturing a low number of photons under low light environments.

In view of the foregoing, multiple exposure (and readout) operations may be performed at a high framerate using a SPAD array to generate separate partial image frames. The separate partial image frames may be combined to form a single composite image. In this regard, persistence is added to SPAD imagery by using image data associated with prior timepoints to generate a composite image (e.g., image data from temporally preceding partial image frames). In contrast, attempting to utilize multiple image frames captured a high framerate to form a single composite image using a conventional CMOS or CCD camera would result in signals dominated by read noise, particularly under low light imaging conditions.

By adding persistence to SPAD imagery (e.g., utilizing multiple image frames captured using a SPAD array to form a single composite image), low light imaging at high frame rate is made possible. For example, partial image frames may be captured sequentially at a high frame rate, while the partial image frames combined to form a composite image may cover a long enough effective total frame capture time period to capture a sufficient number of photons for low light imaging when combined to form the composite image. Furthermore, utilizing a high frame rate for low light image capture (e.g., by utilizing multiple shorter exposures) can reduce the effects of motion artifacts. Mitigated motion artifacts may improve other operations performed by HMDs, such as late stage reprojection, rolling shutter artifact correction, etc.

Furthermore, persistence may be added to SPAD imagery in an intelligent manner. As will be described in more detail hereinbelow, techniques for combining multiple image frames to form a composite image may be modified based on an amount of motion experienced while capturing the multiple image frames or based on an amount of motion observed in the captured environment. For example, for SPAD sensors implemented on an HMD, large amounts of head motion detected while capturing SPAD image frames may cause the SPAD image frames to be combined in a manner that omits or deemphasizes image data from SPAD image frames associated with earlier timepoints. As another example, detecting a moving object captured among a set of captured SPAD image frames may cause the SPAD image frames to be combined in a manner that omits or deemphasizes image data from SPAD image frames associated with earlier timepoints. Such functionality may reduce the number and/or severity of image artifacts that may otherwise result from adding image data to a composite image that depict objects in a spatially inaccurate manner.

Furthermore, as will be described in more detail hereinafter, techniques for combining multiple image frames to form a composite image may be modified based on signal strength. For example, where a most recent SPAD image frame captures a brightly lit object, a system may refrain from utilizing image data from SPAD image frames captured at prior timepoints to represent the brightly lit object in a composite image. Such functionality may prevent the composite image from depicting the brightly lit object in an oversaturated manner.

In addition, the techniques described herein for adding persistence to SPAD imagery may be performed in a computationally efficient manner by generating composite images using a current image frame and a persistence frame that combines image data associated with prior image frames. In some instances, a persistence frame may be conceptualized as a running average of image data and/or other metrics/values for facilitating the combination of image data. Such functionality may advantageously reduce the number of image frames that need to be retained in memory for generating composite SPAD images (e.g., pass-through SPAD imagery under low-light conditions) with persistence added thereto.

Having just described some of the various high-level features and benefits of the disclosed embodiments, attention will now be directed to FIGS. 1 through 20. These Figures illustrate various conceptual representations, architectures, methods, and supporting illustrations related to the disclosed embodiments.

Example Systems and Techniques for Adding Persistence to SPAD Imagery

Attention is now directed to FIG. 1, which illustrates an example system 100 that may include or be used to implement one or more disclosed embodiments. FIG. 1 depicts the system 100 as a head-mounted display (HMD) configured for placement over a head of a user to display virtual content for viewing by the user's eyes. Such an HMD may comprise an augmented reality (AR) system, a virtual reality (VR) system, and/or any other type of HMD. Although the present disclosure focuses, in at least some respects, on a system 100 implemented as an HMD, it should be noted that the techniques described herein may be implemented using other types of systems/devices, without limitation.

FIG. 1 illustrates various example components of the system 100. For example, FIG. 1 illustrates an implementation in which the system includes processor(s) 102, storage 104, sensor(s) 110, I/O system(s) 116, and communication system(s) 118. Although FIG. 1 illustrates a system 100 as including particular components, one will appreciate, in view of the present disclosure, that a system 100 may comprise any number of additional or alternative components.

The processor(s) 102 may comprise one or more sets of electronic circuitries that include any number of logic units, registers, and/or control units to facilitate the execution of computer-readable instructions (e.g., instructions that form a computer program). Such computer-readable instructions may be stored within storage 104. The storage 104 may comprise physical system memory and may be volatile, non-volatile, or some combination thereof. Furthermore, storage 104 may comprise local storage, remote storage (e.g., accessible via communication system(s) 116 or otherwise), or some combination thereof. Additional details related to processors (e.g., processor(s) 102) and computer storage media (e.g., storage 104) will be provided hereinafter.

In some implementations, the processor(s) 102 may comprise or be configurable to execute any combination of software and/or hardware components that are operable to facilitate processing using machine learning models or other artificial intelligence-based structures/architectures. For example, processor(s) 102 may comprise and/or utilize hardware components or computer-executable instructions operable to carry out function blocks and/or processing layers configured in the form of, by way of non-limiting example, single-layer neural networks, feed forward neural networks, radial basis function networks, deep feed-forward networks, recurrent neural networks, long-short term memory (LSTM) networks, gated recurrent units, autoencoder neural networks, variational autoencoders, denoising autoencoders, sparse autoencoders, Markov chains, Hopfield neural networks, Boltzmann machine networks, restricted Boltzmann machine networks, deep belief networks, deep convolutional networks (or convolutional neural networks), deconvolutional neural networks, deep convolutional inverse graphics networks, generative adversarial networks, liquid state machines, extreme learning machines, echo state networks, deep residual networks, Kohonen networks, support vector machines, neural Turing machines, and/or others.

As will be described in more detail, the processor(s) 102 may be configured to execute instructions 106 stored within storage 104 to perform certain actions associated with imaging using SPAD arrays. The actions may rely at least in part on data 108 (e.g., avalanche event counting or tracking, etc.) stored on storage 104 in a volatile or non-volatile manner.

In some instances, the actions may rely at least in part on communication system(s) 118 for receiving data from remote system(s) 120, which may include, for example, separate systems or computing devices, sensors, and/or others. The communications system(s) 120 may comprise any combination of software or hardware components that are operable to facilitate communication between on-system components/devices and/or with off-system components/devices. For example, the communications system(s) 120 may comprise ports, buses, or other physical connection apparatuses for communicating with other devices/components. Additionally, or alternatively, the communications system(s) 120 may comprise systems/components operable to communicate wirelessly with external systems and/or devices through any suitable communication channel(s), such as, by way of non-limiting example, Bluetooth, ultra-wideband, WLAN, infrared communication, and/or others.

FIG. 1 illustrates that a system 100 may comprise or be in communication with sensor(s) 110. Sensor(s) 110 may comprise any device for capturing or measuring data representative of perceivable phenomenon. By way of non-limiting example, the sensor(s) 110 may comprise one or more image sensors, microphones, thermometers, barometers, magnetometers, accelerometers, gyroscopes, and/or others.

FIG. 1 also illustrates that the sensor(s) 110 include SPAD array(s) 112. As depicted in FIG. 1, a SPAD array 112 comprises an arrangement of SPAD pixels 122 that are each configured to facilitate avalanche events in response to sensing a photon, as described hereinabove. SPAD array(s) 112 may be implemented on a system 100 (e.g., an MR HMD) to facilitate image capture for various purposes (e.g., to facilitate computer vision tasks, pass-through imagery, and/or others).

FIG. 1 also illustrates that the sensor(s) 110 include inertial measurement unit(s) 114 (IMU(s) 114). IMU(s) 114 may comprise any number of accelerometers, gyroscopes, and/or magnetometers to capture motion data (e.g., pose data) associated with the system 100 as the system moves within physical space.

Furthermore, FIG. 1 illustrates that a system 100 may comprise or be in communication with I/O system(s) 116. I/O system(s) 116 may include any type of input or output device such as, by way of non-limiting example, a touch screen, a mouse, a keyboard, a controller, and/or others, without limitation. For example, the I/O system(s) 116 may include a display system that may comprise any number of display panels, optics, laser scanning display assemblies, and/or other components. In some instances, a SPAD array 112 may be configured with a resolution of SPAD pixels 122 that matches a pixel resolution of a display system, which may facilitate high-fidelity pass-through imaging.

Figure 2C:
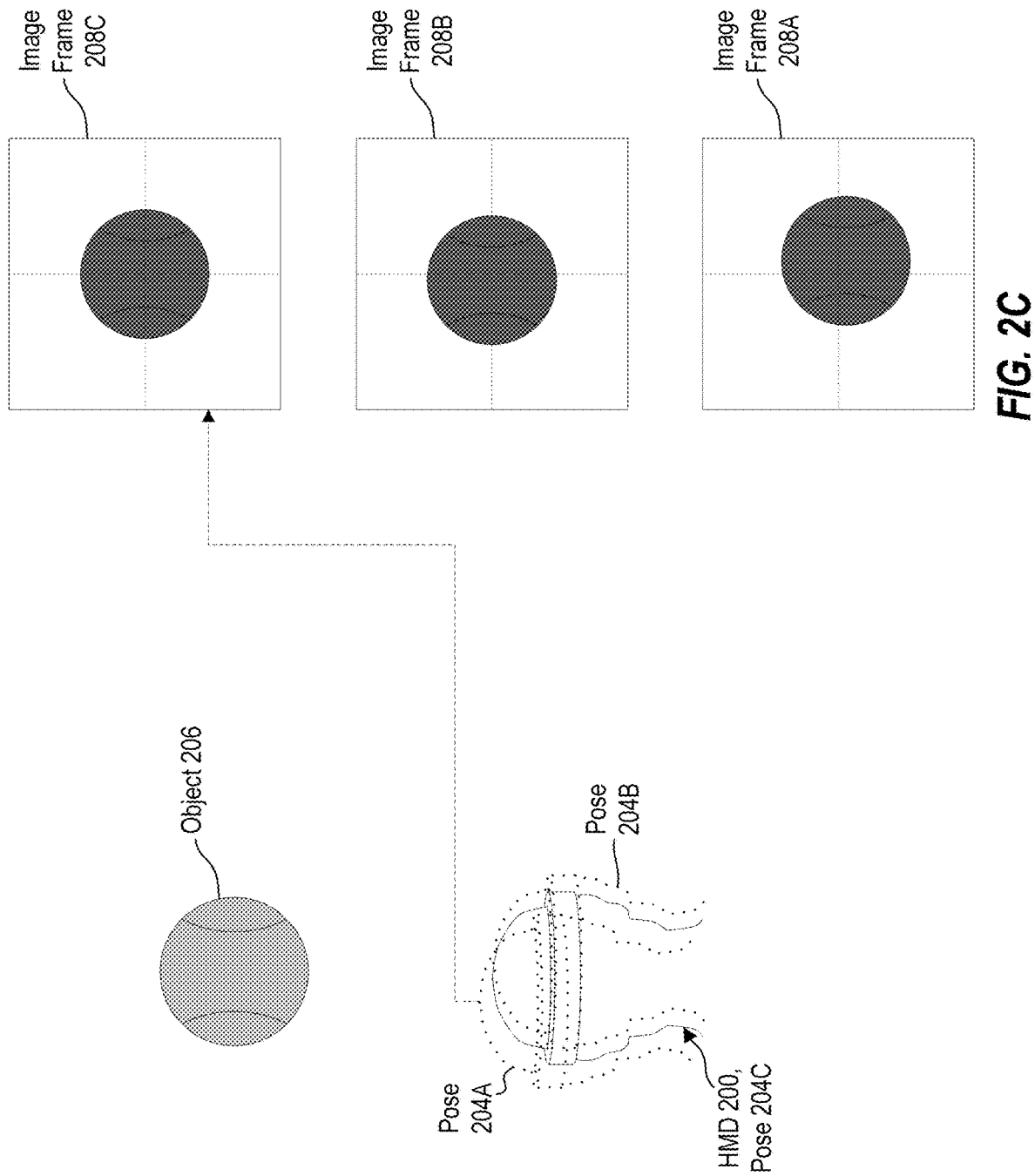

FIGS. 2A-2C illustrate an example of capturing image frames from different poses using a SPAD array of an HMD. In particular, FIG. 2A illustrates HMD 202 positioned at pose 204A while capturing an image of object 206. By way of example only, FIG. 2A illustrates the object 206 as a ball within a low light environment. The HMD 202 may correspond, in at least some respects, to system 100 as discussed hereinabove. For example, HMD 202 includes one or more SPAD arrays 112 that HMD 202 utilizes to capture the object 206. Furthermore, the HMD 202 includes one or more IMUs 114 for detecting pose data associated with the HMD 202 and/or components thereof (e.g., the SPAD array(s) 112 to associate pose data with captured image frames).

While positioned according to pose 204A, the SPAD pixels of the SPAD arrays of the HMD 202 detect photons that trigger avalanche events over a frame capture time period. The HMD 202 uses the detected per-pixel avalanche events to generate per-pixel intensity values for an image frame 208A. Image frame 208A can be associated with pose 204A, which is the pose that existed as the HMD 202 captured image frame 208A. As with any singular term used herein, one will appreciate, in view of the present disclosure, that "pose" may refer to one or more pose values. Similarly, any plural terms used herein may refer to a single element, unless otherwise specified.

As is evident from FIG. 2B, the image frame 208A depicts a dark representation of the object 206. This is to illustrate that, in some instances, the SPAD array(s) of the HMD 202 may capture image frames at a high capture rate (e.g., to combat motion blur), which may limit the number of photons detectable for forming the image frame 208A, particularly when imaging under low light conditions. As will be described hereinafter, the image frame 208A may be combined with other image frames to form a composite image that provides a representation of the object 206 with improved illumination.

FIG. 2B illustrates the HMD 202 positioned according to a new pose 204B (pose 204A is illustrated in dotted lines for reference). FIG. 2B also illustrates the HMD 202 capturing image frame 208B of the object 206 from pose 204B (at a timepoint subsequent to the capturing of image frame 208A from pose 204A). For illustrative purposes, the image frames 208A and 208B of FIG. 2B include vertical and horizontal center lines (illustrated with short-dashed lines) to illustrate the spatial misalignment that occurs between the depictions of the object 206 provided by the image frames 208A and 208B captured from different poses.

FIG. 2C similarly illustrates the HMD 202 positioned according to another new pose 204C as the HMD 202 captures the image frame 208C (at a timepoint subsequent to the capturing of image frame 208B from pose 204B). The image frames 208A, 208B, and 208C each depict the object 206 in a slightly spatially offset manner. For example, image frame 208C depicts the object 206 centrally aligned with the vertical and horizontal centerlines depicted over image frame 208C, while image frame 208B depicts the object 206 offset to the left of the vertical centerline of image frame 208B, whereas image frame 208A depicts the object offset to the right of the vertical centerline and offset below the horizontal centerline of image frame 208A.

Notwithstanding these spatial misalignments, the image frames 208A, 208B, and 208C may be combined to form a composite image, as will be described in more detail hereafter. However, in some instances, it is desirable to dynamically determine the manner of combining image frames to form a composite image (e.g., to account for large movements of the HMD 202 and/or objects in a captured scene).

Figure 3:
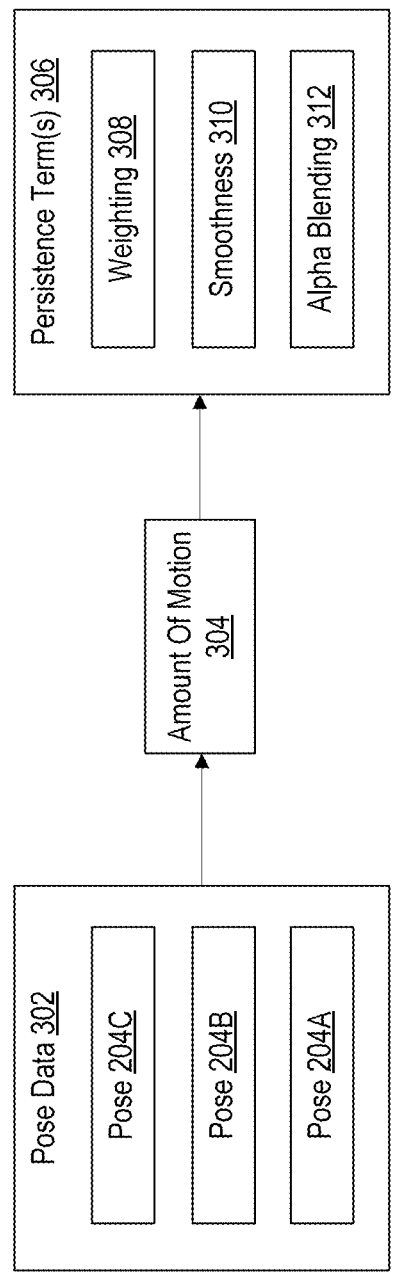
FIG. 3 illustrates a conceptual representation of generating a persistence term based on pose data.

Accordingly, FIG. 3 illustrates pose data 302, which includes information describing the position and/or orientation (e.g., 6 degrees of freedom pose) and/or change of position (e.g., velocity and/or acceleration) and/or change of orientation (e.g., angular velocity and/or angular acceleration) of the HMD 202 (and/or image sensors of the HMD 202) while capturing image frames. In particular, FIG. 3 illustrates the pose data 302 as including or being based on poses 204A, 204B, and 204C, which are the poses associated with the capturing of image frames 208A, 208B, and 208C, respectively (from FIGS. 2A-2C).

FIG. 3 illustrates that the pose data 302 associated with the HMD 202 may indicate an amount of motion 304 (e.g., an amount of positional and/or orientational change) experienced by the HMD 202 over the capturing of the image frames 208A-208C. FIG. 3 also shows that persistence term(s) 306 may be determined based on the amount of motion 304 (or the pose data 302). The persistence term(s) 306 refer(s) broadly to any number(s), variable(s), function(s), term(s), or other element(s) that is/are usable to define a contribution of one or more portions of one or more image frames to a composite image. By way of non-limiting example, persistence term(s) 306 may comprise one or more terms defining alpha blending 312 or alpha compositing, a smoothness term 310, weighting terms 308, etc. Persistence term(s) 306 may be generated in various ways, such as using infinite impulse response techniques. Furthermore, persistence term(s) 306 may be generated in a dynamic manner, such that different pose data associated with different image frames (e.g., of a stream of image frames for forming a pass-through video stream) may give rise to different persistence term(s) 306.

In some instances, where the pose data 302 indicates a large amount of motion 304 associated with the capturing of image frames, persistence term(s) 306 may be selected to cause a reduced contribution to a composite image by image frames associated with earlier timepoints (e.g., image frames 208A and/or 208B relative to image frame 208C). Such a reduction from earlier-timepoint image frames may be advantageous for addressing image artifacts that may otherwise occur from combining image frames in a static manner.

Figure 4:
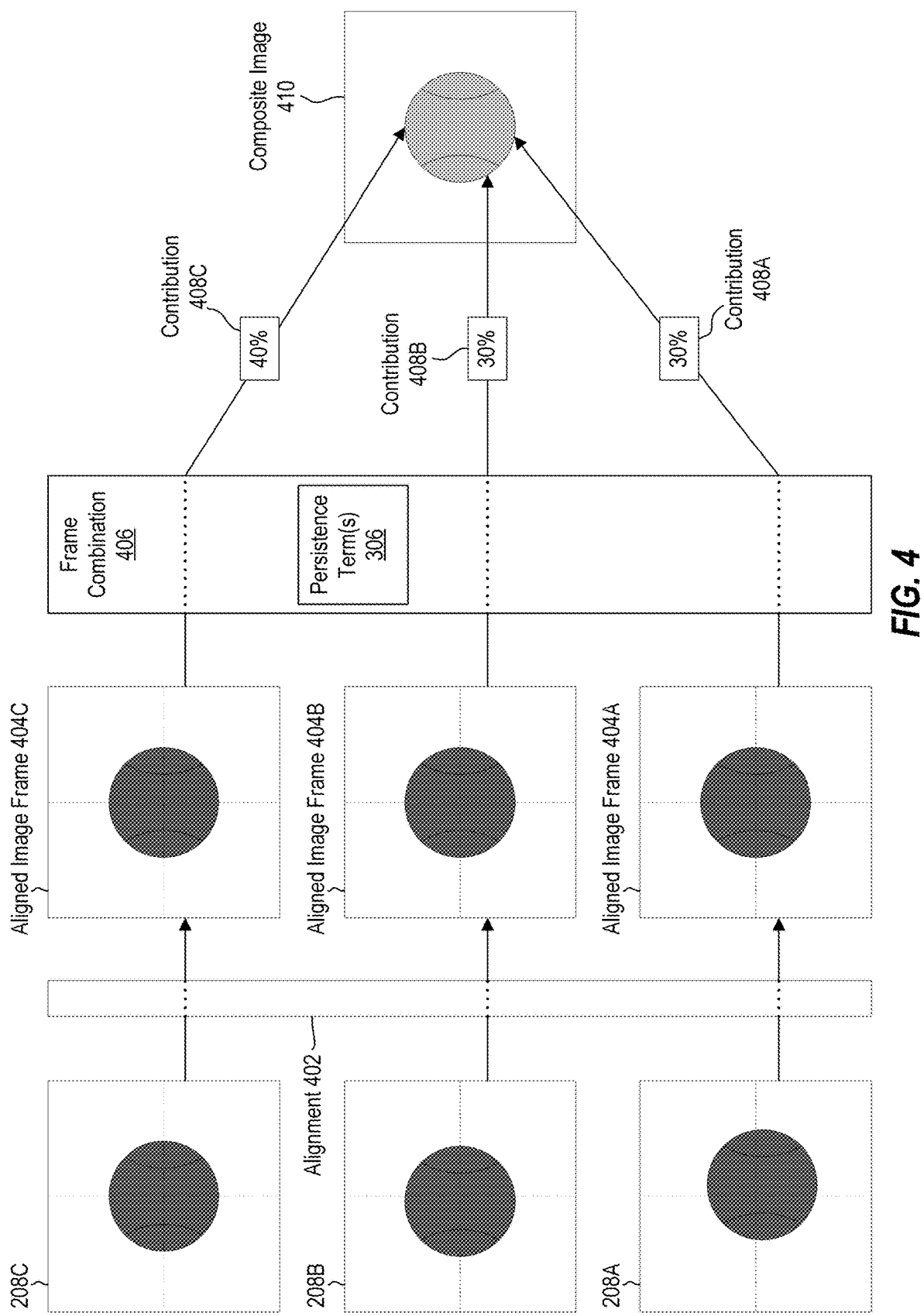
FIGS. 4 and 5 illustrate conceptual representations of generating composite images from captured image frames using persistence terms and pose data.
Figure 5:
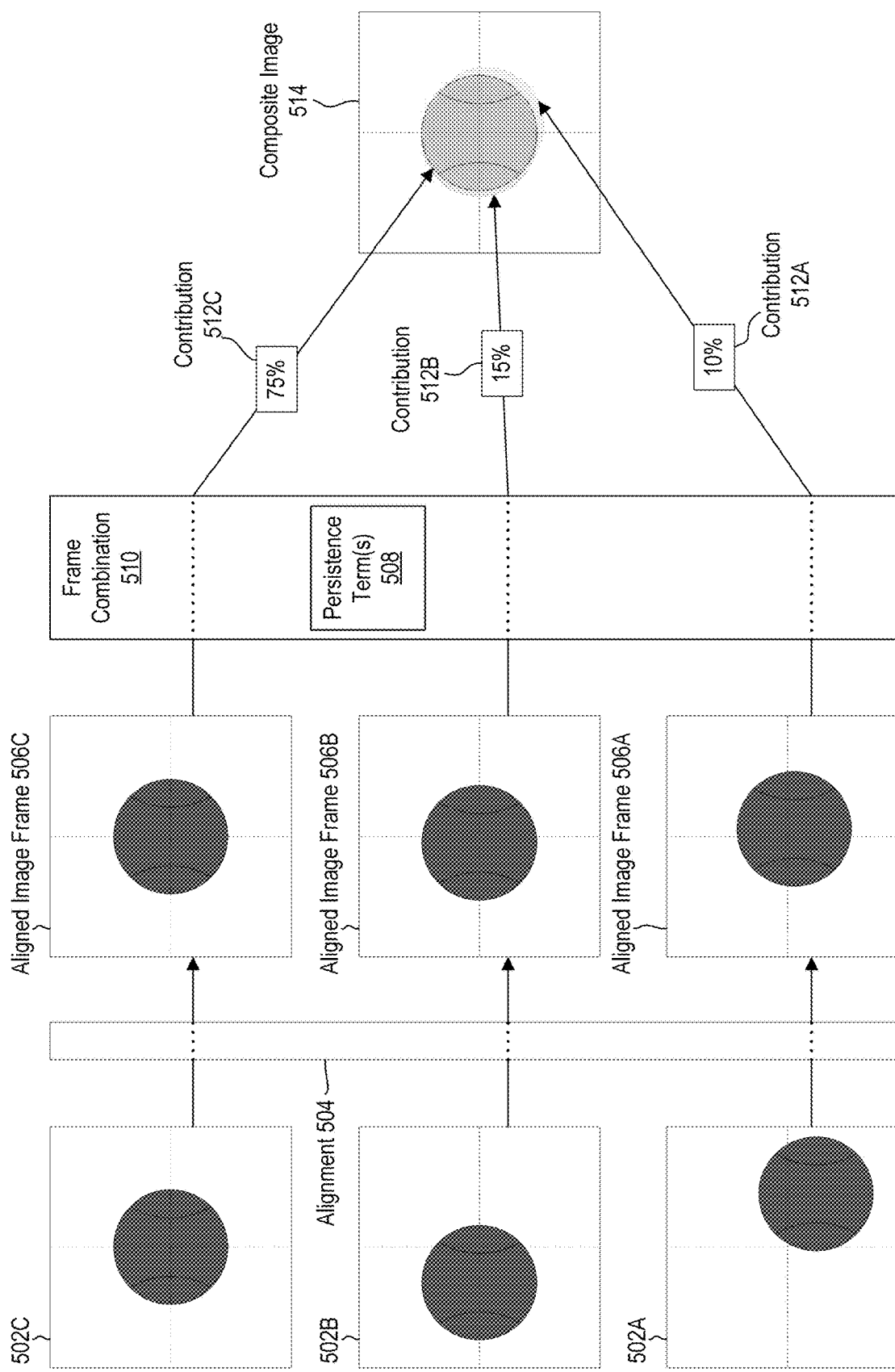

FIGS. 4 and 5 provide examples of using dynamically determined persistence terms to generate composite images and provide insight into the advantages of doing so. In particular, FIG. 4 illustrates image frames 208A-208C from FIGS. 2A-2C. As indicated above, each of the image frames 208A-208C are associated with different timepoints, where image frame 208A is associated with an earliest timepoint (being captured first), image frame 208B is associated with an intermediate timepoint (being captured second), and image frame 208C is associated with a most recent timepoint (being captured third). FIG. 4 illustrates alignment 402, which may comprise reprojection and/or transform operations to correct for parallax between the capture perspectives associated with the different poses 204A-204C from which the image frames 208A-208C were captured (see FIGS. 2A-2C).

As is illustrated in FIG. 4, in some instances, alignment 402 provides aligned image frames 404A, 404B, and 404C, which include depictions of captured objects that are spatially aligned with one another. For example, each of the aligned image frames 404A-404C depict the object 206 centrally aligned with the vertical and horizontal centerlines of the image frames 404A-404C (which corresponds to the spatial alignment of image frame 208C as captured from pose 204C in FIG. 2C). As is evident from FIG. 4, in some instances, spatially aligned image frames appear as though they were captured from the same pose (e.g., from the same capture perspective, or from the same camera position and orientation).

FIG. 4 provides an example in which the amount of motion 304 indicated by the pose data 302 associated with the capture of the image frames 208A-208C is relatively low. In such circumstances, an alignment 402 may be generally successful in providing aligned image frames (e.g., 404A-404C) that are accurately aligned with one another. Accordingly, the persistence term(s) 306 generated based on the pose data 302 may refrain from significantly reducing the contribution of earlier-timepoint image frames (e.g., aligned image frames 404A, 404B) for generating a composite image. Stated differently, the persistence term(s) 306 may be selected, based on the pose data 302, in a manner that avoids unnecessarily restricting the image data that can be combined to form a composite image (e.g., thereby providing a low light image with improved illuminance).

Accordingly, FIG. 4 illustrates frame combination 406, whereby the aligned image frames 404A-404C are combined to form a composite image 410. FIG. 4 illustrates that frame combination 406 relies on persistence term(s) 306, which, as noted above, define contributions of the various aligned image frames 404A-404C (or image frames 208A-208C) to the composite image. FIG. 4 illustrates an instance in which the contribution 408A of the aligned image frame 404A is defined by the persistence term(s) as 30%, the contribution 408B of the aligned image frame 404B is defined by the persistence term(s) as 30%, and the contribution 408C of the aligned image frame 404C is defined by the persistence term(s) as 40%. These particular contributions are illustrative only, and non-limiting, and may be represented in ways other than percentages.

FIG. 4 conceptually represents the image data describing the object 206 from the aligned image frames 404A-404C being combined via frame combination 406 to form a representation of the object 206 in the composite image 410. In some instances, as illustrated in FIG. 4, the depiction of the object 206 in the composite image 410 comprises greater image quality and/or signal strength relative to the depictions of the object 206 in the individual aligned image frames 404A-404C. For example, as noted above, the aligned image frames 404A-404C may capture the object 206 under low light conditions and/or at a high framerate, which may cause the aligned image frames 404A-404C to comprise a relatively low image signal (e.g., by detecting a relatively low number of photons over a frame capture time period). However, these low image signals may be combined to form an image with a greater image signal (i.e., composite image 410). In this way, in some instances, multiple SPAD image frames may be used form a composite image to provide SPAD imagery with added persistence, which may be particularly advantageous when capturing SPAD image frames in low signal environments (e.g., low light environments).

In contrast with FIG. 4, FIG. 5 provides an example in which the amount of motion indicated by the pose data associated with the capture of the image frames is relatively high. FIG. 5 illustrates image frames 502A, 502B, and 502C, which may comprise image frames of the object 206 captured by the HMD 202 from various poses at various timepoints (with image frame 502C being the most recently captured image frame). As is evident from FIG. 5, significant differences exist in the capture perspectives associated with the different image frames 502A-502C. For example, while image frame 502C spatially corresponds to image frame 208C discussed above, image frame 502B depicts the object 206 significantly offset to the left of the vertical centerline of image frame 502B, and image frame 502A depicts the object 206 significantly offset to the right of the vertical centerline and below the horizontal centerline of image frame 502A. As such, in the present example, pose data associated with the capturing of the image frames 502A-502C indicates a large amount of motion (e.g., in contrast with the amount of motion indicated by pose data 302 discussed above).

FIG. 5 illustrates alignment 504 (e.g., similar to alignment 402 of FIG. 4) performed to generate aligned image frames 506A-506C. However, FIG. 5 illustrates an example occurrence wherein at least some of the aligned image frames 506A-506C fail to fully spatially align with one another. For example, although aligned image frame 506C depicts the object 206 centrally aligned with the horizontal and vertical centerlines of the aligned image frame 506C, aligned image frame 506B depicts the object 206 as slightly offset to the left of the vertical centerline of the aligned image frame 506B, and aligned image frame 506C depicts the object 206 offset slightly to the right of the vertical centerline and slightly below the horizontal centerline of the aligned image frame 506C. Such failure to fully align may occur, in some instances, because IMU(s) 114 are susceptible to drift (e.g., compounding errors), which increases with the amount of detected motion. Accordingly, in situations where alignment 504 relies on pose data obtained via IMU(s) 114, misalignments between aligned image frames 506A-506C may occur, particularly where the IMU(s) 114 detect a large amount of motion while capturing image frames 502A-502C.

Where misalignments occur among aligned image frames 506A-506C, combining the aligned image frames 506A-506C to form a composite image in the same manner used to combined aligned image frames that do not include misalignments (e.g., aligned image frames 404A-404C from FIG. 4) may result in significant artifacts in the composite image. To reduce such artifacts, as indicated hereinabove, the combination of the frames may at least partially rely on persistence term(s), which may be dynamically determined based on pose data (e.g., an amount of motion represented by pose data).

For example, FIG. 5 illustrates frame combination 510, which utilizes persistence term(s) 508 to combine the aligned image frames 506A-506C to form the composite image 514. The persistence term(s) 508 governs the contributions of the various image frames (or aligned image frames) to the composite image 514 and may be generated in the same way as the persistence term(s) 306 discussed above (e.g., based on pose data). For example, the persistence term(s) 508 may cause the contribution to the composite image 514 of image frames associated with earlier capture timepoints (e.g., image frames 502A or 502B) to be reduced for higher amounts of motion associated with the capture of the image frames 502A-502C. Stated differently, the contribution of earlier captured image frames (e.g., image frames 502A and/or 502C) may be inversely related to the amount of motion observed during the capture of the set of image frames 502A-502C (or aligned image frames 506A-506C) usable for forming a composite image. One will understand, in view of the present disclosure, that an "earlier" image frame is associated with a timepoint that temporally precedes a timepoint associated with a current image frame or any reference image frame.

Accordingly, in view of the large amount of motion represented by the pose data associated with the capturing of the image frames 502A-502C, FIG. 5 illustrates an instance in which the persistence term(s) 508 define(s) a reduced contribution for aligned image frames 506B and 506A to the composite image 514. In particular, FIG. 5 illustrates an instance in which the contribution 512B of aligned frame 506B to the composite image 514 is 15% and the contribution 512A of aligned image frame 506A to the composite image 514 is 10%. In contrast, FIG. 5 illustrates an increased contribution 512C for the aligned image frame 506C (i.e., a most recently captured image frame) to the composite image 514. Such functionality, in some cases, advantageously gives more weight to the most up-to-date image data for a captured environment.

In this way, techniques of the present disclosure may allow at least some persistence to be added to SPAD imagery to improve image quality in a dynamic manner that accounts for the amount of motion observed during image capture. For example, when a large amount of motion is observed, the amount of persistence added is tailored to the amount of motion observed in a manner that intelligently trades image quality based on the amount of motion observed.

For instance, because multiple image frames are combined to form the depiction of the object 206 in the composite image 514, FIG. 5 shows the object 206 depicted with an improved image signal in the composite image 514 relative to the other image frames 502A-502C individually. FIG. 5 also illustrates minor artifacts in the composite image 514 resulting from the contributions of aligned image frame 506A (shown at the arrowhead of the arrow extending from aligned image frame 506A to the composite image 514) and resulting from the contributions of aligned image frame 506B (shown at the arrowhead of the arrow extending from aligned image 506B to the composite image 514). Although such artifacts may result from combining frames captured under a large amount of motion, the significance of such artifacts may be balanced in favor of the improved image signal facilitated by frame combination when the persistence term(s) 508 that govern frame combination is/are determined dynamically based on pose/motion data.

Frame combination 406, 510 may take on various forms for stacking or combining image frames, such as a direct summation (or weighted summation), alpha compositing, and/or other combining or filtering techniques. In some instances, frame combination 406, 510 may comprise or implement a function that defines contribution to a composite image based on temporal remoteness from a current or reference timepoint (e.g., a Gaussian function), and the function may be modified by the persistence term(s) 306, 506 based on pose data.

In some instances, the composite images 410, 514 may be reprojected to correspond to the perspective of a user's eye and be displayed on a display of the HMD 202 to facilitate pass-through imaging. Such functionality may be particularly advantageous for facilitating pass-through imaging under low light conditions.

Figure 6:
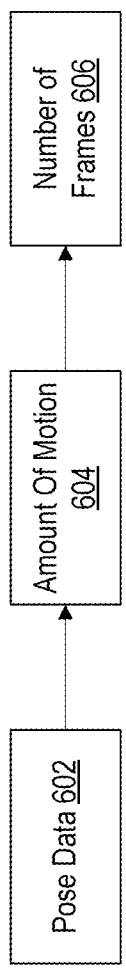
FIG. 6 illustrates a conceptual representation of selecting a number of frames based on pose data.

In some instances, rather than determining a persistence term based on pose data to govern the contributions of image frames to a composite image, systems of the present disclosure determine a number of image frames to use for generating a composite image based on pose data. For example, FIG. 6 illustrates that pose data 602 may indicate an amount of motion 604, as discussed above. FIG. 6 also illustrates that a number of frames 606 may be selected based on the pose data 602 and/or amount of motion 604. The number of frames 606 may determine a subset of image frames from a set of image frames to use for generating a composite image. In this way, a system may refrain from using earlier-timepoint image frames to form a composite image when a large amount of motion is detected, thereby reducing potential artifacts that may occur from using temporally remote image frames to form the composite image.

Figure 7:
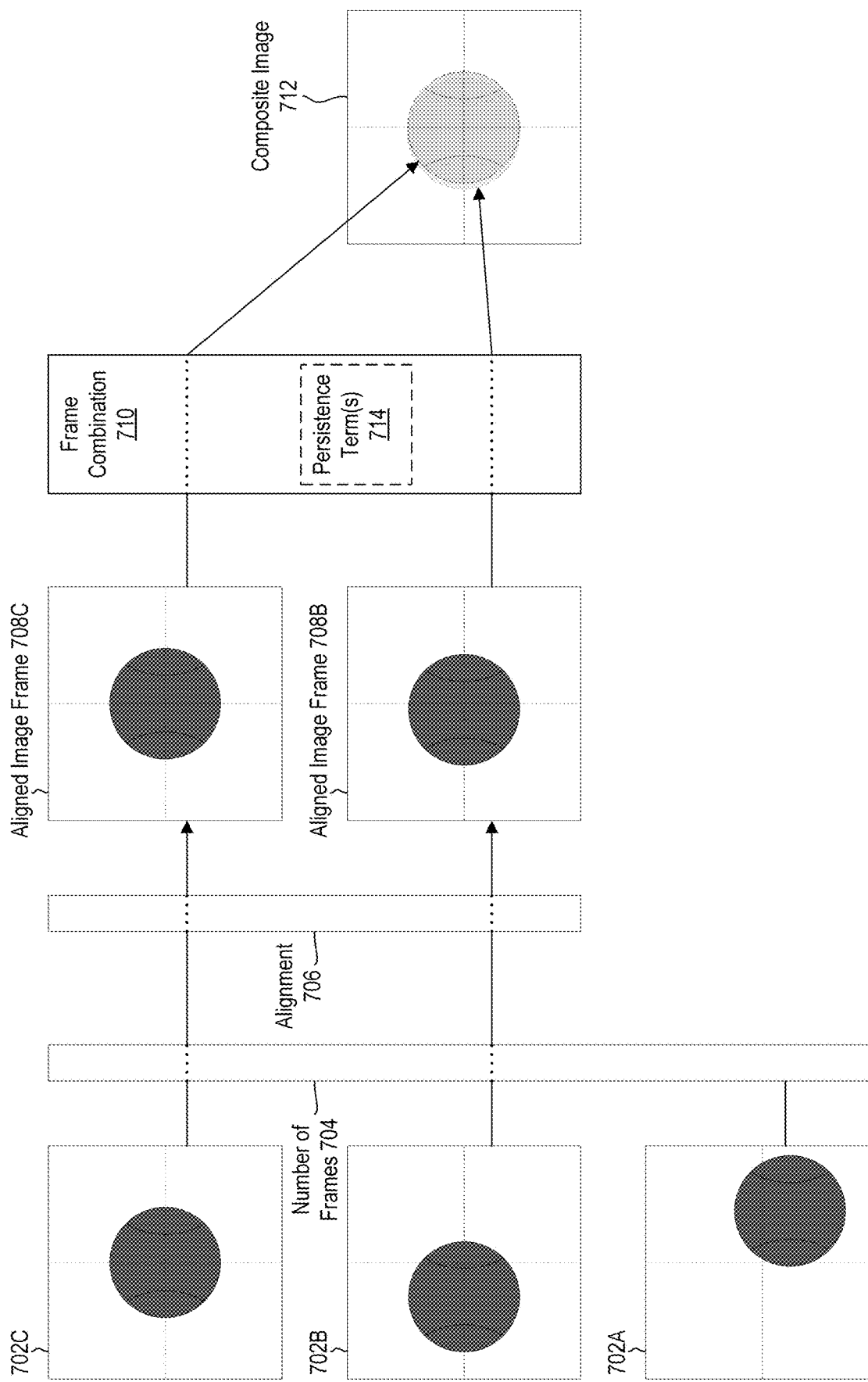
FIG. 7 illustrates a conceptual representation of generating a composite image from captured image frames using a selected number of frames and pose data.

FIG. 7 illustrates a conceptual representation of generating a composite image from captured image frames using a selected number of frames and pose data. In particular, FIG. 7 illustrates image frames 702A-702C, which correspond to image frames 502A-502C of FIG. 5 (e.g., with image frame 702C being associated with a most recent timepoint, and with image frame 702A being associated with an earliest timepoint). FIG. 7 conceptually depicts that a number of frames 704 may be selected from the initial set of image frames 702A-702C. The number of frames 704 may be based on the amount of motion associated with the capturing of the initial set of image frames 702A-702C (e.g., based on pose data associated with the set of image frames 702A-702C). In the example shown in FIG. 7, the number of frames 704 determines, based on pose data, that two image frames from the initial set of three image frames 702A-702C should be used to form a composite image.

Accordingly, FIG. 7 shows that image frames 702B and 702C become aligned with one another according to alignment 706 pursuant to forming a composite image, whereas image frame 702A is omitted from further processing to form the composite image. Alignment 706 may correspond generally to alignment 504 and/or 402 discussed above. Alignment 706 provides aligned image frames 708B and 708C, with some spatial discrepancies existing among the aligned image frames 708B and 708C (e.g., similar to the spatial discrepancies that exist among aligned image frames 506B and 506C discussed above with reference to FIG. 5).

FIG. 7 furthermore illustrates the aligned image frames 708B and 708C being combined according to frame combination 710 to form the composite image 712. In this regard, systems may refrain from using image data associated with at least some earlier-timepoint image frames when forming a composite image, particularly for image frame sets captured under high motion conditions. Such functionality may reduce the amount or severity of artifacts present in composite images, while still providing a SPAD image with added persistence.

In some instances, the functionality of omitting image frames via the intelligently determined number of frames 704 may be combined with the principles discussed above of utilizing persistence term(s) to facilitate frame combination 710. Accordingly, FIG. 7 depicts that the frame combination 710 may optionally be based on persistence term(s) 714 (illustrated in dashed lines in FIG. 7). For example, image frame 702A may be omitted from consideration for forming the composite image 712, and image frames 702B and 702C may be blended together based on persistence term(s) 714 that are determined based on the amount of motion associated with the capturing of image frames 702B and 702C.

Accordingly, the amount of persistence in SPAD imagery may be intelligently determined based on the amount of motion experienced by the SPAD image sensors during image capture. Additionally, or alternatively, the amount of persistence in SPAD imagery may be determined based on an amount of motion exhibited by objects captured within the SPAD imagery.

Figure 8B:
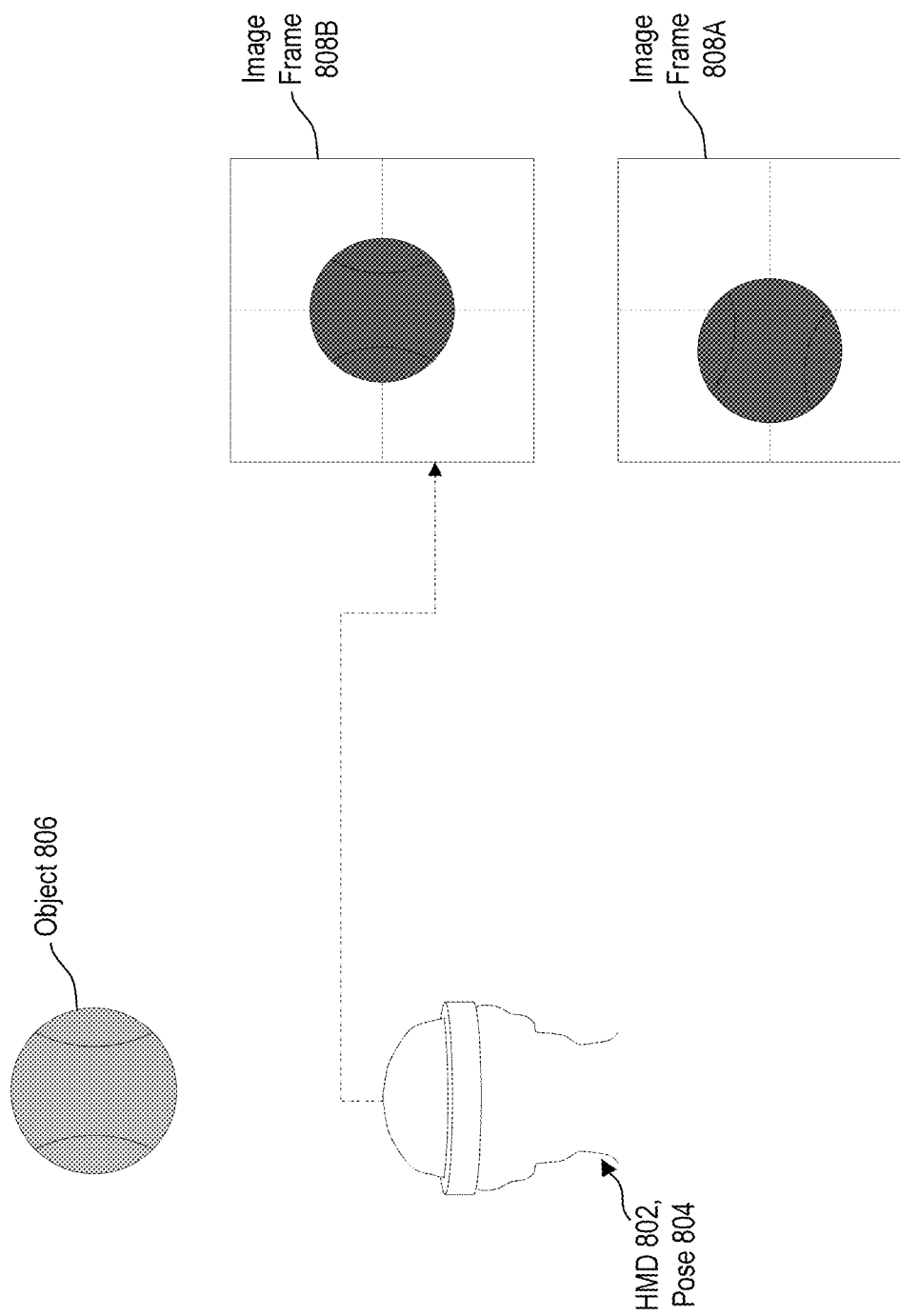
Figure 8C:
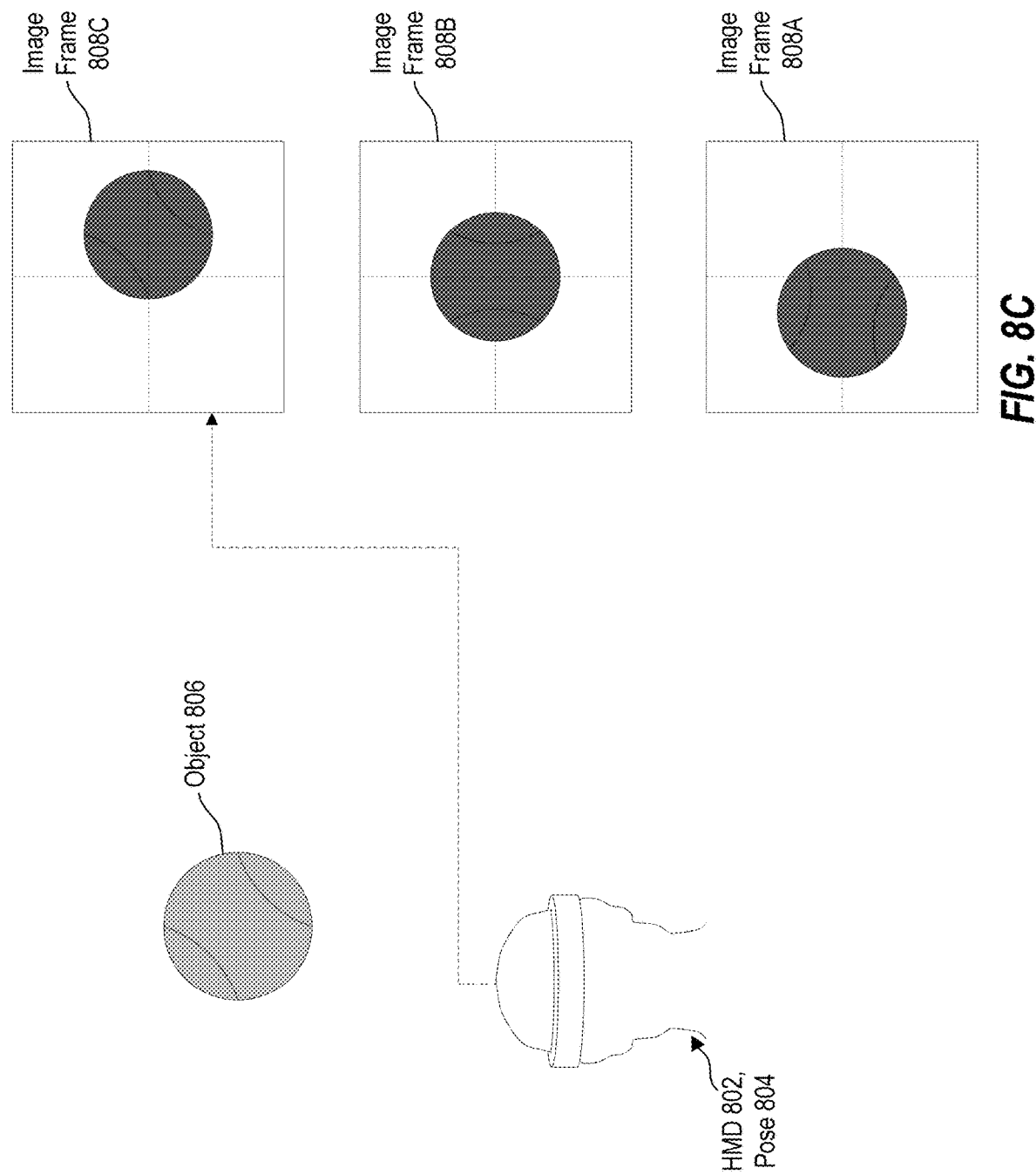

FIGS. 8A-8C illustrate an example of capturing image frames of a moving object using a SPAD array of an HMD. In particular, FIG. 8A shows an HMD 802 positioned according to pose 804 as the HMD 802 captures an image frame 808A of an object 806. The HMD 802 may correspond generally to HMD 202 discussed above. For example, HMD 802 includes at least one SPAD array 112 for capturing image frame 808A.

FIG. 8B illustrates the HMD 802 still positioned according to pose 804 as the HMD 802 captures image frame 808B of the object 806. Similarly, FIG. 8C illustrates the HMD 802 capturing image frame 808C of the object 806 while the HMD 802 is still positioned according to pose 804. As is evident from FIGS. 8A-8C, image frames 808A-808C capture the object 806 as the object 806 changes position via rolling. Accordingly, the depictions of the object 806 in the various image frames 808A-808C are spatially misaligned with one another, even though the image frames 808A-808C were all captured by the HMD 802 from the same pose 804.

To account for such spatial misalignments when forming a composite image from image frames 808A-808C, a system may determine persistence term(s) based on similarity between the image frames 808A-808C.

Figure 9:
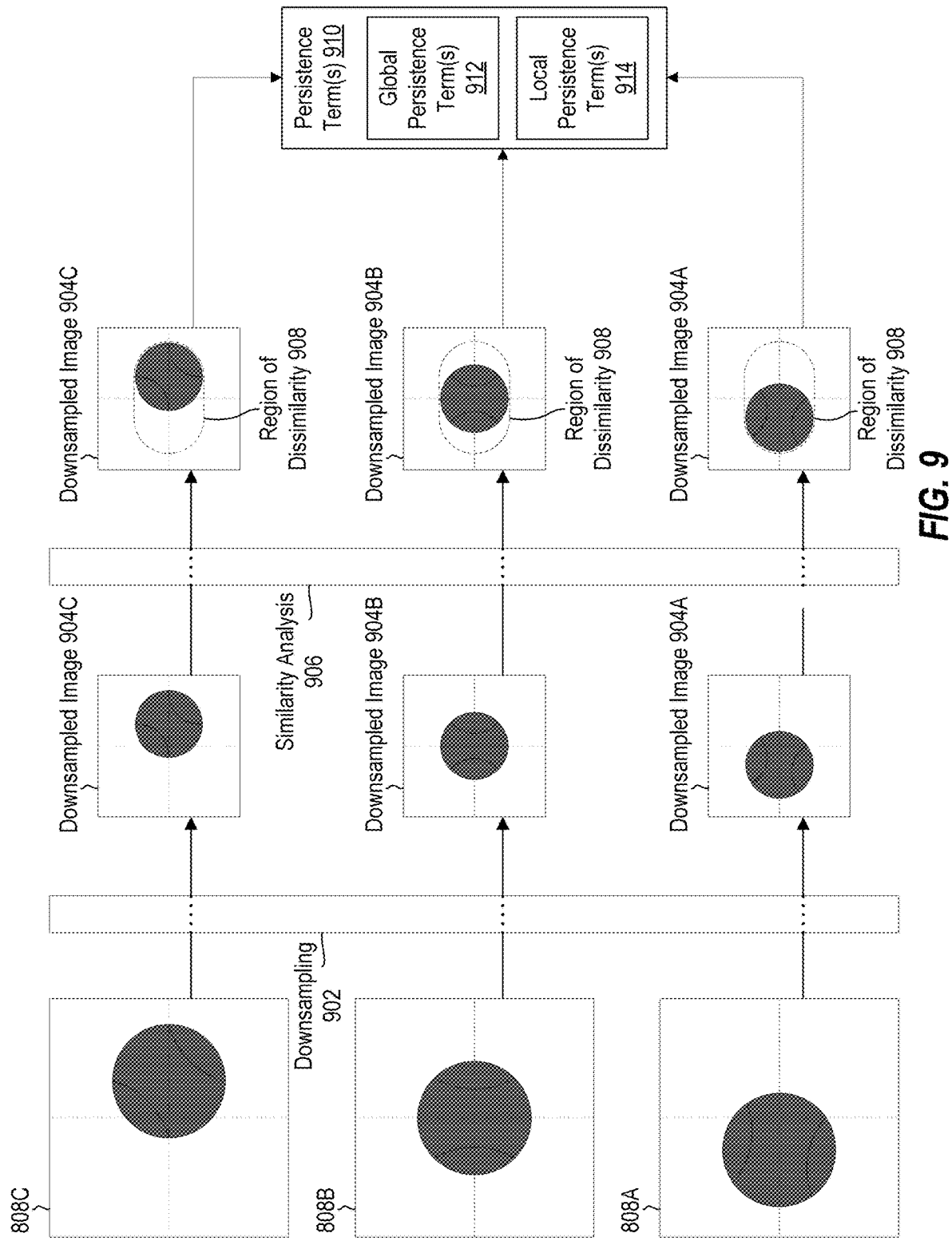
FIG. 9 illustrates a conceptual representation of generating a local persistence term based on a similarity analysis performed on downsampled image frames.

Accordingly, FIG. 9 illustrates a conceptual representation of generating a local persistence term based on a similarity analysis. In particular, FIG. 9 shows the image frames 808A-808C discussed above with reference to FIGS. 8A-8C. FIG. 9 also illustrates downsampling 902 performed to generate downsampled images 904A, 904B, and 904C from image frames 808A-808C, respectively. Downsampling 902 may include reducing sections of pixels in an original image (e.g., image frames 808A-808C) to a single pixel in the downsampled image (e.g., downsampled images 904A-904C). For example, in some instances, each pixel in a downsampled image is defined by a pixel of an original image:

$$p_d(m,n) = p(Km, Kn)$$

where $p_d$ is the pixel in the downsampled image, p is the pixel in the original image, K is a scaling factor, m is the pixel coordinate in the horizontal axis, and n is the pixel coordinate in the vertical axis. In some instances, the downsampling 902 also includes prefiltering functions for defining the pixels of the downsampled image, such as anti-aliasing prefiltering to prevent aliasing artifacts.

In some implementations, downsampling 902 utilizes an averaging filter for defining the pixels of the downsampled image based on the average of a section of pixels in the original image. In one example of downsampling by a factor of 2 along each axis, each pixel in the downsampled image is defined by an average of a 2×2 section of pixels in the original image:

$$p_d(m, n) = \frac{[p(2m, 2n) + p(2m, 2n+1) + p(2m+1, 2n) + p(2m+1, 2n+1)]}{4}$$

where $p_d$ is the pixel in the downsampled image, p is the pixel in the original image, m is the pixel coordinate in the horizontal axis, and n is the pixel coordinate in the vertical axis. Downsampling 902 may comprise iterative downsampling operations that are performed iteratively to arrive at a downsampled image of a desired final image resolution.

FIG. 9 illustrates similarity analysis 906 performed on the downsampled images 904A-904C. Similarity analysis 906 may comprise any operation usable to identify similarities or differences (e.g., regions of dissimilarity) between at least two images (or portions thereof). For example, similarity analysis 906 may comprise template matching techniques (e.g., sum square difference, cross-correlation), feature/descriptor matching techniques (e.g., utilizing SIFT, SURF, BRIEF, BRISK, FAST, and/or others), histogram analysis techniques, artificial intelligence techniques (e.g., deep learning), structural similarity index measure techniques, combinations thereof, and/or others.

FIG. 9 shows that, in some instances, the similarity analysis 906 indicates a region of dissimilarity 908 among the downsampled images 904A-904C. The region of dissimilarity 908 may comprise a pixel region where sufficient differences exist between the downsampled images 904A-904C. In the example shown in FIG. 9, because each of the downsampled images 904A-904C capture the object 806 with different positioning (e.g., as the object 806 moved during image capture), the region of dissimilarity 908 comprises a pixel region formed from a combination of the pixel regions that depict the object 806 in the various downsampled images 904A-904C. In this regard, a region of dissimilarity 908 may indicate an amount of motion exhibited by one or more objects captured in a set of image frames.

As is shown in FIG. 9, persistence term(s) 910 may be determined based on the similarity analysis 906. For example, where the similarity analysis 906 indicates dissimilarity among the downsampled images 904A-904C, a system may select persistence term(s) 910 that define a reduced contribution of prior-timepoint image frames (e.g., image frames 808B and/or 808A) to a composite image. In contrast, where the similarity analysis 906 does not indicate significant dissimilarity among the downsampled images 904A-904C, the system may select persistence term(s) 910 that provide a more balanced contribution of all of the image frames 808A-808C to a composite image. In this regard, the persistence term(s) 910 may define an inverse relationship between the amount of dissimilarity between a set of image frames and the contribution of prior-timepoint image frames of the set of image frames to a composite image. For example, where dissimilarity is associated with motion exhibited by captured objects, greater motion of captured objects may cause a reduced contribution of prior-timepoint image frames to a composite image.

In the example shown in FIG. 9, the persistence term(s) 910 may comprise global persistence term(s) 912 and local persistence term(s) 914. Global persistence term(s) 912 may define contributions of all pixel regions of image frames for forming a composite image, whereas local persistence term(s) 914 may define contributions of particular pixel regions of image frames for forming a composite image. For example, local persistence term(s) 914 may be defined for the region of dissimilarity 908 of the downsampled images 904A-904C, which may cause one set of contributions to be defined for the region of dissimilarity 908 of the downsampled images 904A-904C (e.g., defining a reduced contribution of prior-timepoint image frames for the region of dissimilarity 908) and another set of contributions to be defined for regions outside of the region of dissimilarity of the downsampled images 904A-904C. In this way, the amount of persistence present in a composite image may be selectively adjusted for different portions of the composite image (even down to the pixel level).

Although not illustrated in FIG. 9, the image frames 808A-808C maybe aligned with one another (e.g., using an alignment operation similar to those discussed above) before or after the application of any downsampling operations. Such alignment may be beneficial when a moving object is captured while the HMD 802 also moves during image capture. Furthermore, it will be appreciated, in view of the present disclosure, that similarity analysis may be performed on image frames without first downsampling the image frames.

Figure 10:
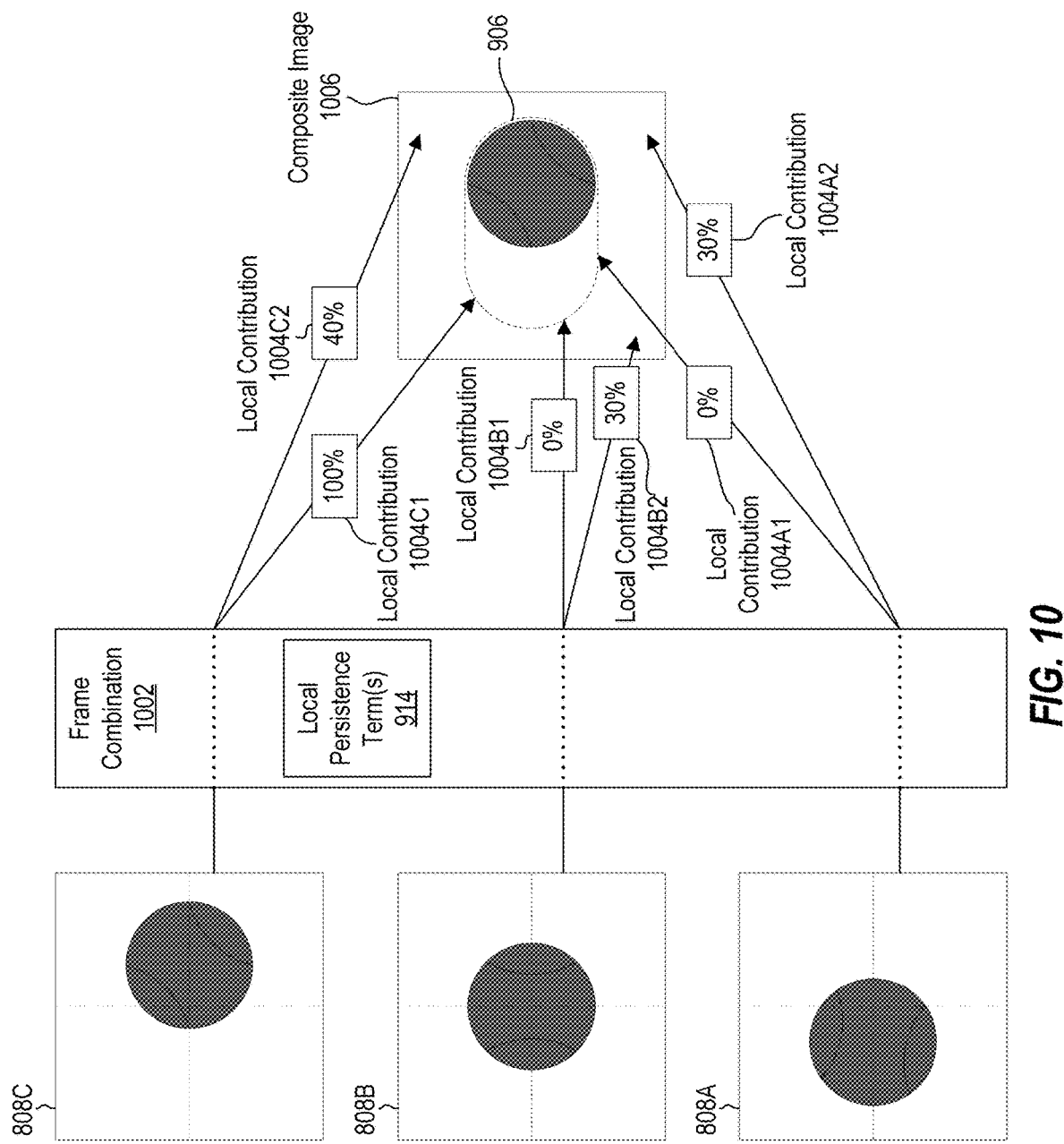
FIG. 10 illustrates a conceptual representation of generating a composite image from captured image frames using local persistence terms.

FIG. 10 illustrates a conceptual representation of generating a composite image from captured image frames using local persistence terms. In particular, FIG. 10 shows frame combination 1002 performed on the image frames 808A-808C to generate a composite image 1006. The frame combination 1002 may correspond generally to frame combination 406 and/or 510 as discussed above. FIG. 10 illustrates that the frame combination 1002 is at least partially based on the local persistence term(s) 914 discussed above. For example, the local persistence term(s) 914 define different contributions from the image frames 808A-808C for different portions of the composite image 1006.

For instance, FIG. 10 depicts the region of dissimilarity 908 discussed above with reference to FIG. 9. As noted above, the region of dissimilarity 908 comprises a region of pixels in which differences existed among the image frames 808A-808C (or downsampled images 904A-904C formed from the image frames 808A-808C). Accordingly, the local persistence term(s) 914 define an increased contribution from the most recently captured image frame (i.e., image frame 808C) for the region of dissimilarity 908. The local persistence term(s) 914 also define a reduced contribution from the prior-timepoint image frames (i.e., image frames 808B and 808A) for the region of dissimilarity 908.

For example, FIG. 10 illustrates a local contribution 1004C1 of 100% from image frame 808C for defining the image pixels within the region of dissimilarity 908 of the composite image 1006. FIG. 10 also illustrates local contributions 1004B1 and 1004A1 of 0% from image frames 808B and 808A, respectively, for defining the image pixels within the region of dissimilarity 908 of the composite image 1006. In this way, techniques of the present disclosure may use the most up-to-date image data to depict objects within the region of dissimilarity 908, thereby avoiding or reducing artifacts within the region of dissimilarity and/or providing users with more accurate spatial representations of captured moving objects.

Outside of the region of dissimilarity, the local persistence term(s) 914 may define a more balanced contribution of the various image frames 808A-808C to the composite image 1006). For example, FIG. 10 illustrates a local contribution 1004C2 of 40% from image frame 808C for defining the image pixels outside of the region of dissimilarity 908 of the composite image 1006. FIG. 10 also illustrates local contributions 1004B2 and 1004A2 of 30% from image frames 808B and 808A, respectively, for defining the image pixels outside of the region of dissimilarity 908 of the composite image 1006. By tailoring different local persistence values to different portions of the composite image 1006, techniques of the present disclosure may add persistence to SPAD imagery to improve image quality where adverse effects from doing so (e.g., object artifacts and/or ghosting) are unlikely to occur (e.g., outside of regions of dissimilarity).

It should be noted that the principles discussed with reference to FIGS. 2-7 may be combined with the principles discussed with reference to FIGS. 8A-10. For example, persistence term(s) for defining contributions of image frames for generating a composite image may be selected based on motion of the image sensor (e.g., based on IMU data associated with the image capture) and/or motion detected in the capture scene (e.g., based on dissimilarity between captured images).

Figure 11:
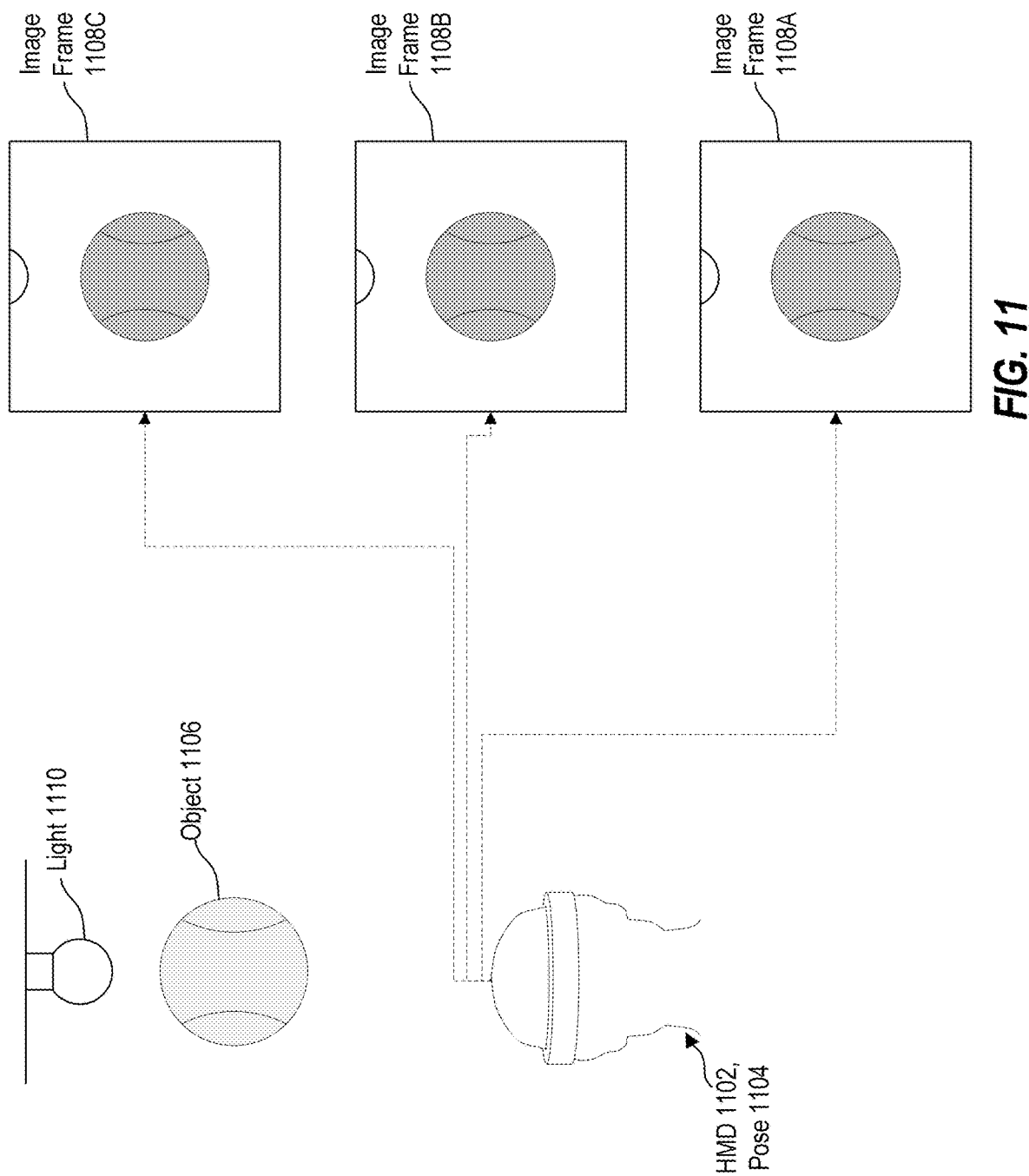
FIG. 11 illustrates an example of capturing image frames of a moving object using a SPAD array of an HMD.

FIG. 11 illustrates an example of capturing image frames of a moving object using a SPAD array of an HMD. In particular, FIG. 11 shows an HMD 1102 positioned according to pose 1104 as the HMD 1102 consecutively captures image frames 1108A, 1108B, and 1108C of an object 1106 and a light 1110. The HMD 1102 may correspond generally to HMD 202 discussed above. For example, HMD 1102 includes at least one SPAD array 112 for capturing image frames 1108A-1108C.

The image frames 1108A-1108C include depictions of the light 1110 and the object 1106. FIG. 11 shows the image frames 1108A-1108C depicting the light 1110 with high signal strength or brightness (e.g., in contrast to the dark representations of the object 206 in image frames 208A-208C and 502A-502C). In this regard, the image frames 1108A-1108C may individually provide a desirable representation of the light 1110 without adding persistence to the image frames 1108A-1108C.

In contrast with the depictions of the light 1110 in the image frames 1108A-1108C, the image frames 1108A-1108C include depictions of the object 1106 that are slightly darkened, indicating that persistence may be added to provide an improved depiction of the object 1106. However, although globally adding persistence to the image frames 1108A-1108C may improve the depiction of the object 1106, doing so may degrade the representation of the light 1110 by oversaturating the representation of the light 1110.

Accordingly, techniques of the present disclosure include selectively adding persistence to different portions of SPAD imagery based on signal strength to avoid depicting well-illuminated objects in an overly bright manner.

Figure 12:
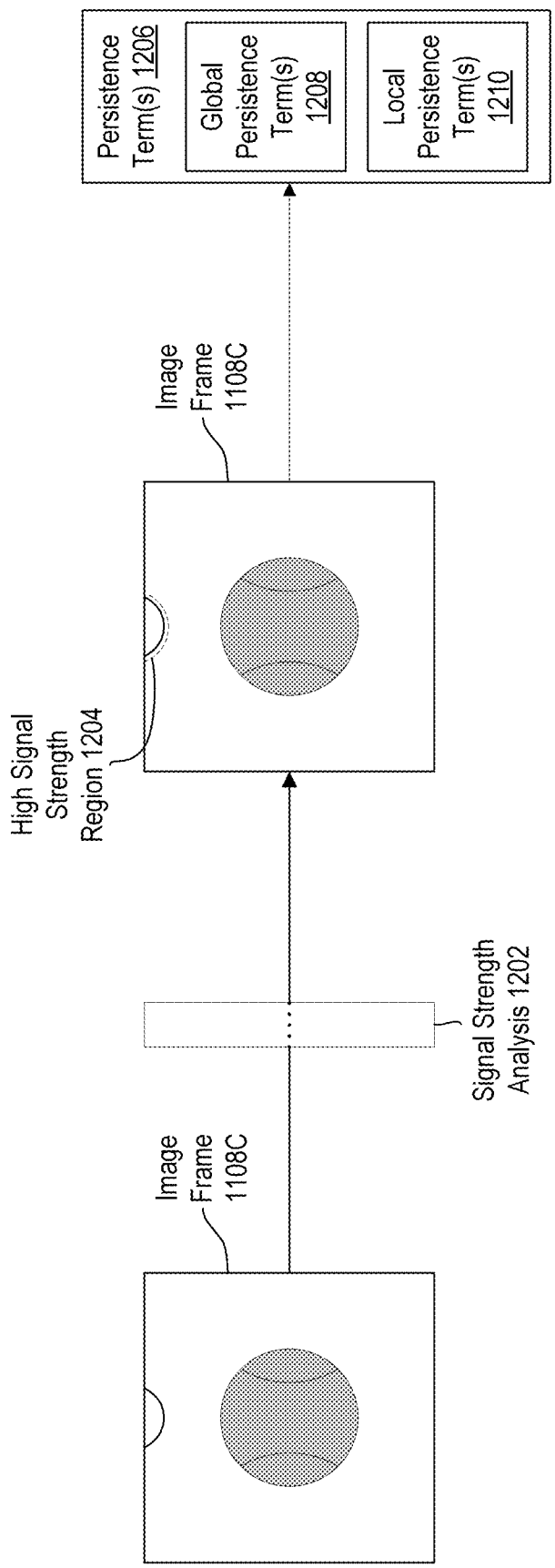
FIG. 12 illustrates a conceptual representation of generating a local persistence term based on a signal strength analysis performed on an image frame.

FIG. 12 illustrates a conceptual representation of generating a local persistence term based on a signal strength analysis performed on an image frame. In particular, FIG. 12 illustrates image frame 1108C, which corresponds to the most recently captured image frame of the set of image frames 1108A-1108C of FIG. 11. FIG. 12 also illustrates signal strength analysis 1202 performed on the image frame 1108C. Signal strength analysis 1202 may comprise thresholding the image pixels of the image frame 1108C to identify one or more regions of image pixels (or individual image pixels) that include intensity values that satisfy one or more intensity thresholds. For example, FIG. 12 illustrates a high signal strength region 1204 corresponding to the depiction of the light 1110 in the image frame 1108C.

FIG. 12 illustrates that persistence term(s) 1206 may be generated based on the results of the signal strength analysis 1202 (e.g., the presence of the high signal strength region 1204 and/or or other regions of sufficient signal strength). Similar to persistence term(s) 910 discussed above with reference to FIG. 9, persistence term(s) 1206 may comprise global persistence term(s) 1208 and/or local persistence term(s) 1210. For example, local persistence term(s) 1210 may define a reduced contribution of prior-timepoint image frames for the high signal strength region 1204 and a different, more balanced contribution of prior-timepoint image frames for regions outside of the high signal strength region 1204. In some instances, reducing contributions of prior-timepoint image frames based on the signal strength associated with regions of pixels (or particular pixels) may avoid oversaturation of depictions of objects in composite images.

Figure 13:
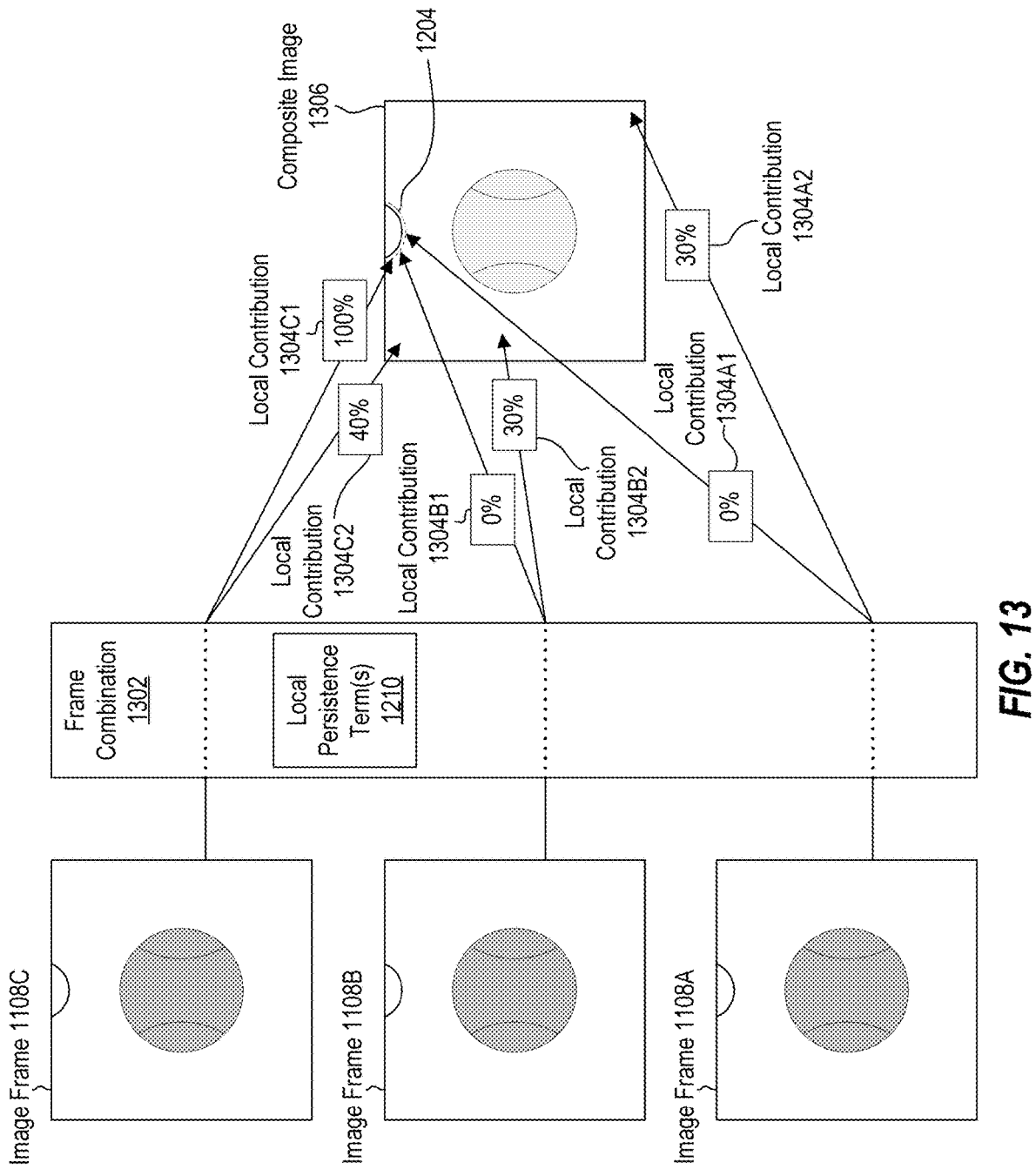
FIG. 13 illustrates a conceptual representation of generating a composite image from captured image frames using local persistence terms.

FIG. 13 illustrates a conceptual representation of generating a composite image from captured image frames using local persistence terms determined based on signal strength. In particular, FIG. 13 shows frame combination 1302 performed on image frames 1108A-1108C from FIG. 11 to generate a composite image 1306. The frame combination may correspond generally to frame combination 406, 510, and/or 1002 discussed above. FIG. 13 illustrates that frame combination 1302 is at least partially based on the local persistence term(s) 1210 discussed above. For example, the local persistence term(s) 1210 define different contributions from the image frames 1108A-1108C for different portions of the composite image 1006.

For instance, FIG. 13 depicts the high signal strength region 1204 discussed above with reference to FIG. 12. As noted above, the high signal strength region 1204 comprises a region of pixels that satisfy a threshold signal strength. Accordingly, the local persistence term(s) 1210 define a reduced contribution from the prior-timepoint image frames (i.e., image frames 1108B and 1108A) for the high signal strength region 1204 to avoid oversaturating objects represented within the high signal strength region 1204.

For example, FIG. 13 illustrates a local contribution 1304C1 of 100% from image frame 1108C for defining the image pixels within the high signal strength region 1204 of the composite image 1306. FIG. 13 also illustrates local contributions 1304B1 and 1304A1 from image frames 1108B and 1108A, respectively, for defining the image pixels within the high signal strength region 1204. In this way, techniques of the present disclosure may refrain from oversaturating objects depicted within the high signal strength region 1204.

Outside of the region of dissimilarity, the local persistence term(s) 1210 may define a more balanced contribution of the various image frames 1108A-1108C to the composite image 1306). For example, FIG. 13 illustrates a local contribution 1304C2 of 40% from image frame 1108C for defining the image pixels outside of the high signal strength region 1204 of the composite image 1306. FIG. 13 also illustrates local contributions 1304B2 and 1304A2 of 30% from image frames 1108B and 1108A, respectively, for defining the image pixels outside of the high signal strength region 1204 of the composite image 1306. By tailoring different local persistence values to different portions of the composite image 1306, techniques of the present disclosure may add persistence to SPAD imagery to improve image quality where adverse effects from doing so (e.g., oversaturation) are unlikely to occur (e.g., outside of high signal strength regions). For example, as shown in FIG. 13, by using image data from all of the image frames 1108A-1108C to depict the object 1106 within the composite image 1306, the composite image 1306 depicts the object 1106 with improved signal strength relative to the depictions of the object 1106 within each of the image frames 1108A-1108C individually.

Although the examples of FIGS. 11-13 focus, in at least some respects, on contributions of prior-timepoint image frames for a single high signal strength region, it will be appreciated, in view of the present disclosure, that different contributions of prior-timepoint image frames may be used for different image pixel regions. For example, signal strength analysis may identify moderate signal strength regions and/or low signal strength regions. Based on the identification of the different regions of different signal strengths, the persistence term(s) may define a moderate contribution of prior-timepoint image frames for defining image pixels of a composite image within the moderate signal strength region, and the persistence term(s) may define a high contribution of prior-timepoint image frames for defining image pixels of the composite image within the low signal strength region.

It should be noted that the principles discussed with reference to FIGS. 2-10 may be combined with the principles discussed with reference to FIGS. 11-13. For example, persistence term(s) for defining contributions of image frames for generating a composite image may be selected based on motion of the image sensor (e.g., based on IMU data associated with the image capture), motion detected in the capture scene (e.g., based on dissimilarity between captured images), and/or signal strength of captured images or portions thereof.

Furthermore, although the foregoing examples have focused on combining three image frames to form composite images, any number of image frames may be used.

Example Method(s) for Adding Persistence to SPAD Imagery

The following discussion now refers to a number of methods and method acts that may be performed by the disclosed systems. Although the method acts are discussed in a certain order and illustrated in a flow chart as occurring in a particular order, no particular ordering is required unless specifically stated, or required because an act is dependent on another act being completed prior to the act being performed. One will appreciate that certain embodiments of the present disclosure may omit one or more of the acts described herein.

FIGS. 14, 15, 16, and 17 illustrate example flow diagrams 1400, 1500, 1600, and 1700, respectively, depicting acts associated with adding persistence to SPAD imagery. The discussion of the various acts represented in the flow diagrams include references to various hardware components described in more detail with reference to FIG. 1.

Figure 14:
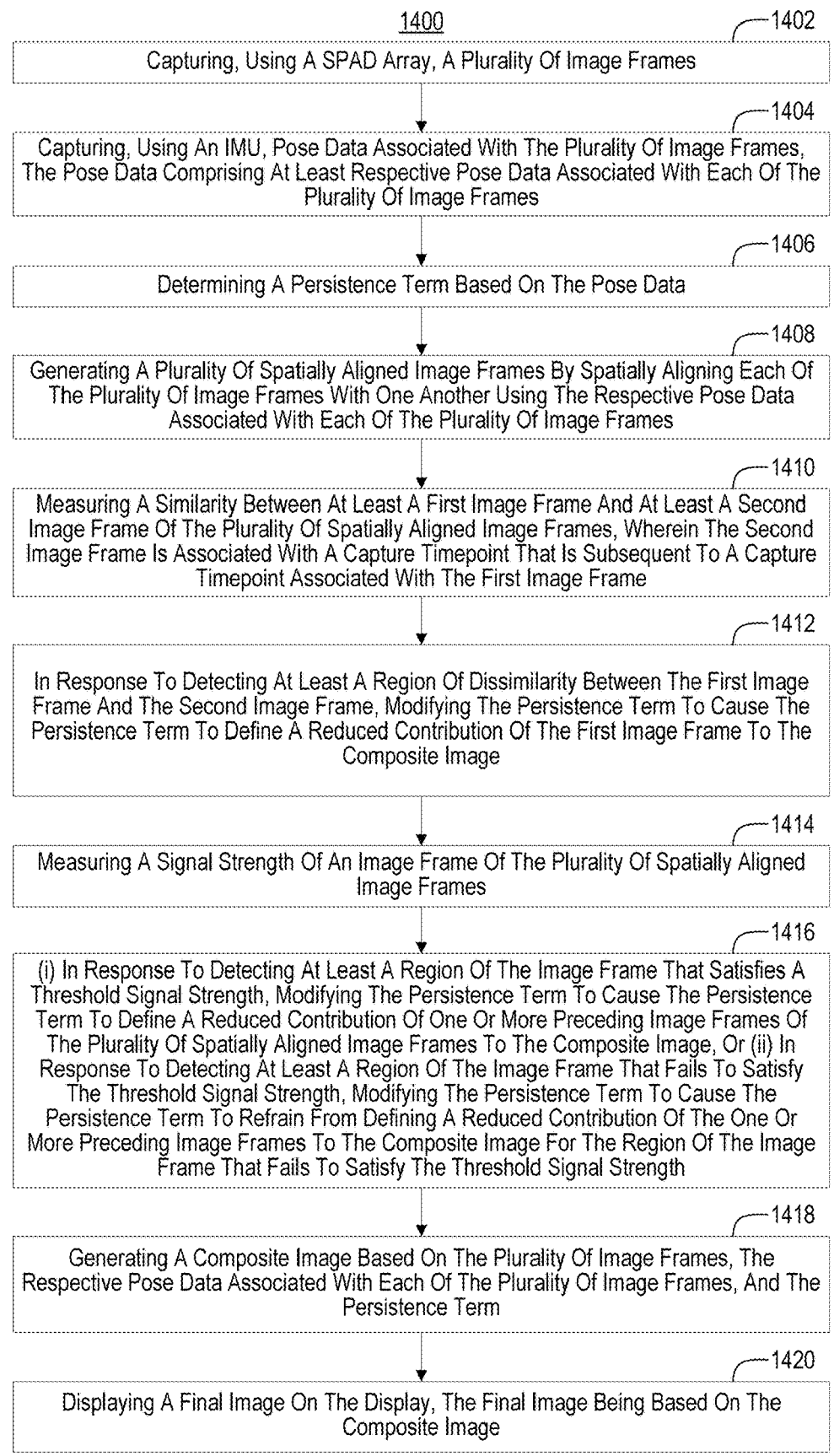
FIG. 14-17 illustrate example flow diagrams depicting acts associated with adding persistence to SPAD imagery.

Act 1402 of flow diagram 1400 of FIG. 14 includes capturing, using a SPAD array, a plurality of image frames. Act 1402 is performed, in some instances, by a system utilizing processor(s) 102, storage 104, sensor(s) 110, input/output system(s) 116, communication system(s) 118, and/or other components. In some instances, each of the plurality of image frames is associated with a respective capture timepoint.

Act 1404 of flow diagram 1400 includes capturing, using an IMU, pose data associated with the plurality of image frames, the pose data comprising at least respective pose data associated with each of the plurality of image frames. Act 1404 is performed, in some instances, by a system utilizing processor(s) 102, storage 104, sensor(s) 110, input/output system(s) 116, communication system(s) 118, and/or other components. In some instances, the pose data represents an amount of motion associated with the capture of the plurality of image frames.

Act 1406 of flow diagram 1400 includes determining a persistence term based on the pose data. Act 1406 is performed, in some instances, by a system utilizing processor(s) 102, storage 104, sensor(s) 110, input/output system(s) 116, communication system(s) 118, and/or other components. In some instances, the persistence term defines a contribution of each of the plurality of image frames to the composite image. The persistence term may cause the contribution to the composite image of image frames associated with earlier capture timepoints to be reduced for higher amounts of motion associated with the capture of the plurality of image frames.

Act 1408 of flow diagram 1400 includes generating a plurality of spatially aligned image frames by spatially aligning each of the plurality of image frames with one another using the respective pose data associated with each of the plurality of image frames. Act 1408 is performed, in some instances, by a system utilizing processor(s) 102, storage 104, sensor(s) 110, input/output system(s) 116, communication system(s) 118, and/or other components.

Act 1410 of flow diagram 1400 includes measuring a similarity between at least a first image frame and at least a second image frame of the plurality of spatially aligned image frames, wherein the second image frame is associated with a capture timepoint that is subsequent to a capture timepoint associated with the first image frame. Act 1410 is performed, in some instances, by a system utilizing processor(s) 102, storage 104, sensor(s) 110, input/output system(s) 116, communication system(s) 118, and/or other components. In some instances, measuring the similarity between the first image frame and the second image frame includes generating a downsampled first image frame by downsampling the first image frame, generating a downsampled second image frame by downsampling the second image frame, and measuring a similarity between the downsampled first image frame and the downsampled second image frame.

Act 1412 of flow diagram 1400 includes, in response to detecting at least a region of dissimilarity between the first image frame and the second image frame, modifying the persistence term to cause the persistence term to define a reduced contribution of the first image frame to the composite image. Act 1412 is performed, in some instances, by a system utilizing processor(s) 102, storage 104, sensor(s) 110, input/output system(s) 116, communication system(s) 118, and/or other components. In some instances, the modified persistence term defines a reduced contribution of the first image frame to the composite image frame for the region of dissimilarity.

Act 1414 of flow diagram 1400 includes measuring a signal strength of an image frame of the plurality of spatially aligned image frames. Act 1414 is performed, in some instances, by a system utilizing processor(s) 102, storage 104, sensor(s) 110, input/output system(s) 116, communication system(s) 118, and/or other components.

Act 1416 of flow diagram 1400 includes (i) in response to detecting at least a region of the image frame that satisfies a threshold signal strength, modifying the persistence term to cause the persistence term to define a reduced contribution of one or more preceding image frames of the plurality of spatially aligned image frames to the composite image, or (ii) in response to detecting at least a region of the image frame that fails to satisfy the threshold signal strength, modifying the persistence term to cause the persistence term to refrain from defining a reduced contribution of the one or more preceding image frames to the composite image for the region of the image frame that fails to satisfy the threshold signal strength. Act 1416 is performed, in some instances, by a system utilizing processor(s) 102, storage 104, sensor(s) 110, input/output system(s) 116, communication system(s) 118, and/or other components. In some instances, the one or more preceding image frames are associated with one or more timepoints that precede a timepoint associated with the image frame. Furthermore, in some instances, the modified persistence term defines a reduced contribution of the one or more preceding image frames to the composite image for the region of the image frame that satisfies the threshold signal strength.

Act 1418 of flow diagram 1400 includes generating a composite image based on the plurality of image frames, the respective pose data associated with each of the plurality of image frames, and the persistence term. Act 1418 is performed, in some instances, by a system utilizing processor(s) 102, storage 104, sensor(s) 110, input/output system(s) 116, communication system(s) 118, and/or other components. In some instances, the composite image is based on the spatially aligned image frames.

Act 1420 of flow diagram 1400 includes displaying a final image on the display, the final image being based on the composite image. Act 1420 is performed, in some instances, by a system utilizing processor(s) 102, storage 104, sensor(s) 110, input/output system(s) 116, communication system(s) 118, and/or other components.

Figure 15:
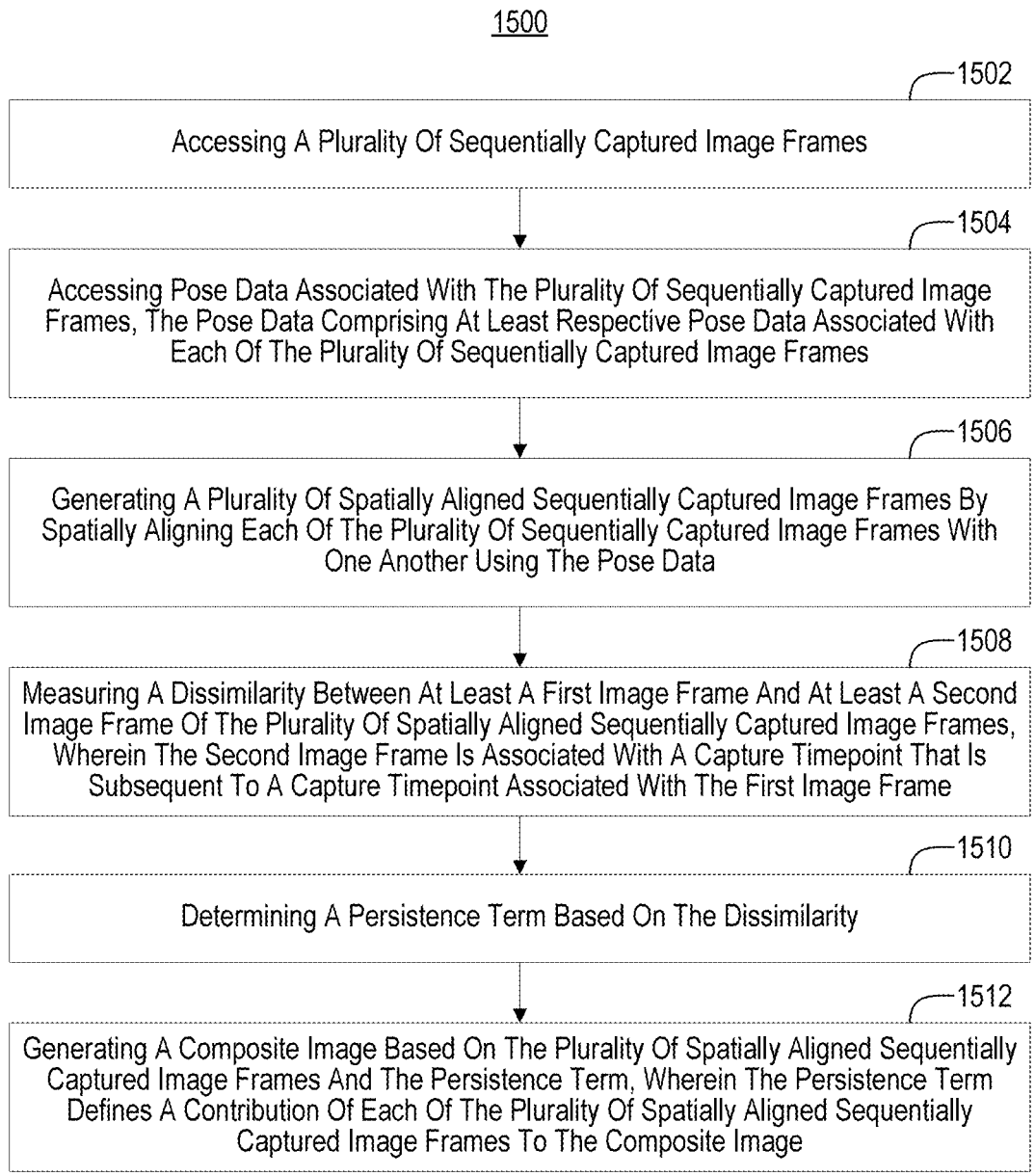

Act 1502 of flow diagram 1500 of FIG. 15 includes accessing a plurality of sequentially captured image frames. Act 1502 is performed, in some instances, by a system utilizing processor(s) 102, storage 104, sensor(s) 110, input/output system(s) 116, communication system(s) 118, and/or other components. In some instances, the plurality of sequentially captured image frames is captured using a single photon avalanche diode (SPAD) array comprising a plurality of SPAD pixels.

Act 1504 of flow diagram 1500 includes accessing pose data associated with the plurality of sequentially captured image frames, the pose data comprising at least respective pose data associated with each of the plurality of sequentially captured image frames. Act 1504 is performed, in some instances, by a system utilizing processor(s) 102, storage 104, sensor(s) 110, input/output system(s) 116, communication system(s) 118, and/or other components. In some instances, the pose data represents an amount of motion associated with a capturing of the plurality of sequentially captured image frames.

Act 1506 of flow diagram 1500 includes generating a plurality of spatially aligned sequentially captured image frames by spatially aligning each of the plurality of sequentially captured image frames with one another using the pose data. Act 1506 is performed, in some instances, by a system utilizing processor(s) 102, storage 104, sensor(s) 110, input/output system(s) 116, communication system(s) 118, and/or other components.

Act 1508 of flow diagram 1500 includes measuring a dissimilarity between at least a first image frame and at least a second image frame of the plurality of spatially aligned sequentially captured image frames, wherein the second image frame is associated with a capture timepoint that is subsequent to a capture timepoint associated with the first image frame. Act 1508 is performed, in some instances, by a system utilizing processor(s) 102, storage 104, sensor(s) 110, input/output system(s) 116, communication system(s) 118, and/or other components. In some instances, the dissimilarity represents an amount of motion exhibited by an objected captured in the first image frame and in the second image frame. Furthermore, in some instances, measuring the dissimilarity between the first image frame and the second image frame includes generating a downsampled first image frame by downsampling the first image frame, generating a downsampled second image frame by downsampling the second image frame, and measuring a similarity between the downsampled first image frame and the downsampled second image frame.

Act 1510 of flow diagram 1500 includes determining a persistence term based on the dissimilarity. Act 1510 is performed, in some instances, by a system utilizing processor(s) 102, storage 104, sensor(s) 110, input/output system(s) 116, communication system(s) 118, and/or other components. In some instances, the persistence term causes the contribution to the composite image of the first image frame to be reduced for higher values of the dissimilarity. Furthermore, in some instances, in response to identifying a region of dissimilarity between the first image frame and the second image frame, the persistence term defines a reduced contribution of the first image frame to the composite image frame for the region of dissimilarity. Still furthermore, in some instances, the persistence term is at least partially based on the pose data.

Act 1512 of flow diagram 1500 includes generating a composite image based on the plurality of spatially aligned sequentially captured image frames and the persistence term, wherein the persistence term defines a contribution of each of the plurality of spatially aligned sequentially captured image frames to the composite image. Act 1512 is performed, in some instances, by a system utilizing processor(s) 102, storage 104, sensor(s) 110, input/output system(s) 116, communication system(s) 118, and/or other components.

Figure 16:
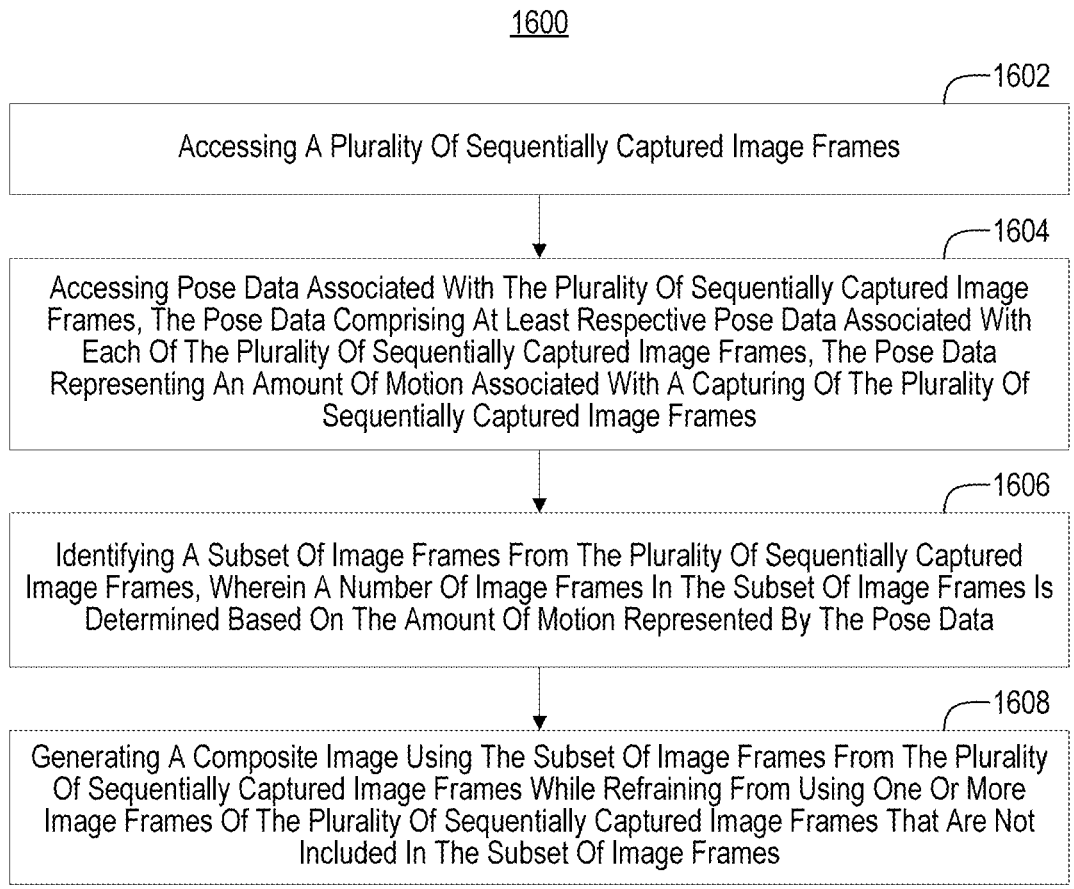

Act 1602 of flow diagram 1600 of FIG. 16 includes accessing a plurality of sequentially captured image frames. Act 1602 is performed, in some instances, by a system utilizing processor(s) 102, storage 104, sensor(s) 110, input/output system(s) 116, communication system(s) 118, and/or other components.

Act 1604 of flow diagram 1600 includes accessing pose data associated with the plurality of sequentially captured image frames, the pose data comprising at least respective pose data associated with each of the plurality of sequentially captured image frames, the pose data representing an amount of motion associated with a capturing of the plurality of sequentially captured image frames. Act 1604 is performed, in some instances, by a system utilizing processor(s) 102, storage 104, sensor(s) 110, input/output system(s) 116, communication system(s) 118, and/or other components.

Act 1606 of flow diagram 1600 includes identifying a subset of image frames from the plurality of sequentially captured image frames, wherein a number of image frames in the subset of image frames is determined based on the amount of motion represented by the pose data. Act 1606 is performed, in some instances, by a system utilizing processor(s) 102, storage 104, sensor(s) 110, input/output system(s) 116, communication system(s) 118, and/or other components.

Act 1608 of flow diagram 1600 includes generating a composite image using the subset of image frames from the plurality of sequentially captured image frames while refraining from using one or more image frames of the plurality of sequentially captured image frames that are not included in the subset of image frames. Act 1608 is performed, in some instances, by a system utilizing processor(s) 102, storage 104, sensor(s) 110, input/output system(s) 116, communication system(s) 118, and/or other components. In some instances, generating the composite image comprises spatially aligning the image frames of the subset of image frames with one another using the respective pose data associated with each image frame of the subset of image frames.

Figure 17:
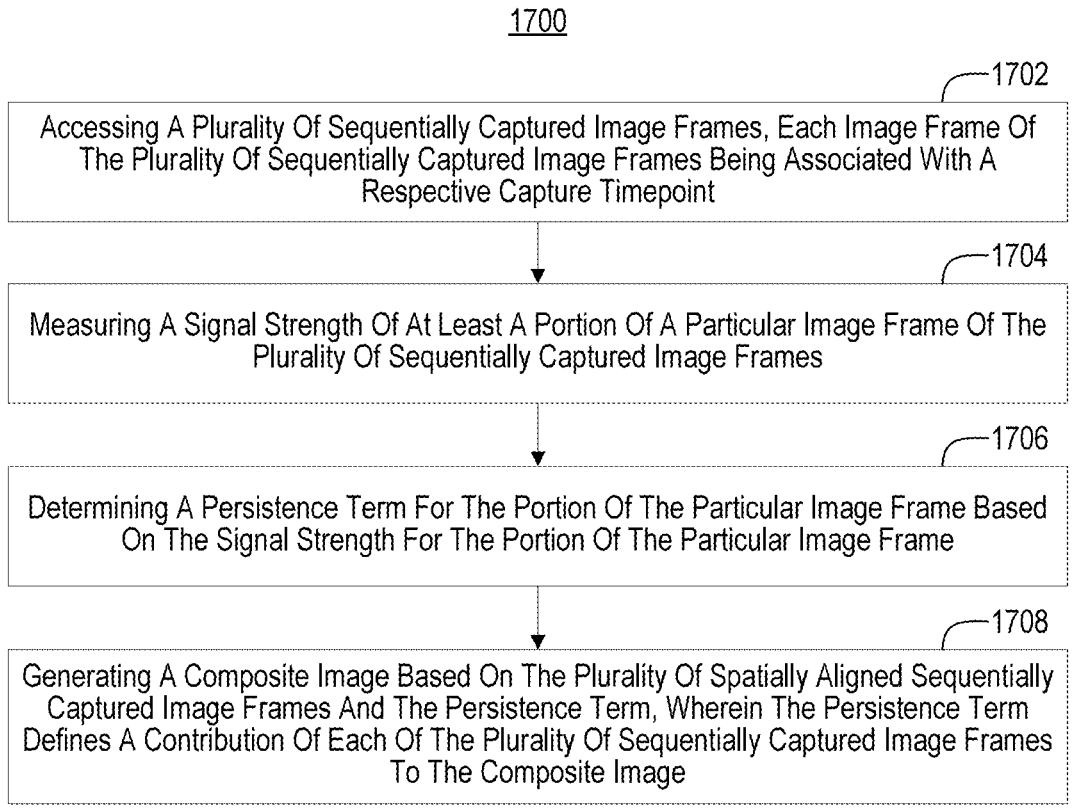

Act 1702 of flow diagram 1700 of FIG. 17 includes accessing a plurality of sequentially captured image frames, each image frame of the plurality of sequentially captured image frames being associated with a respective capture timepoint. Act 1702 is performed, in some instances, by a system utilizing processor(s) 102, storage 104, sensor(s) 110, input/output system(s) 116, communication system(s) 118, and/or other components.

Act 1704 of flow diagram 1700 includes measuring a signal strength of at least a portion of a particular image frame of the plurality of sequentially captured image frames. Act 1704 is performed, in some instances, by a system utilizing processor(s) 102, storage 104, sensor(s) 110, input/output system(s) 116, communication system(s) 118, and/or other components.

Act 1706 of flow diagram 1700 includes determining a persistence term for the portion of the particular image frame based on the signal strength for the portion of the particular image frame. Act 1706 is performed, in some instances, by a system utilizing processor(s) 102, storage 104, sensor(s) 110, input/output system(s) 116, communication system(s) 118, and/or other components.

Act 1708 of flow diagram 1700 includes generating a composite image based on the plurality of spatially aligned sequentially captured image frames and the persistence term, wherein the persistence term defines a contribution of each of the plurality of sequentially captured image frames to the composite image. Act 1708 is performed, in some instances, by a system utilizing processor(s) 102, storage 104, sensor(s) 110, input/output system(s) 116, communication system(s) 118, and/or other components. In some instances, a portion of the composite image corresponds to the portion of the particular image frame. Furthermore, in some instances, the persistence term causes the contribution of one or more preceding image frames to the portion of the composite image to be reduced for higher measured signal strength of the portion of the particular image frame. The one or more preceding image frames may be part of the plurality of sequentially captured image frames and may be associated with one or more capture timepoints that precede a capture timepoint associated with the particular image frame.

Techniques for Efficient Generation of SPAD Imagery with Persistence

The techniques discussed above for dynamically adding persistence to SPAD imagery may provide improved fidelity and/or usability of SPAD images in a manner that is tailored to different situations (e.g., high motion head or captured object motion, bright captured objects, etc.). However, maintaining multiple image frames in memory to generate composite images can be computationally costly, particularly where the number of image frames desired for generating a composite image is large.

Accordingly, techniques of the present disclosure include utilizing a persistence frame to collect information from prior-timepoint image frames, allowing prior-timepoint image frames to be omitted from memory. A persistence frame may then be used in combination with a newly captured image frame to generate a new composite image. The new composite image may comprise persistence added from the persistence frame in an intelligent manner, as discussed hereinabove.

Figure 18:
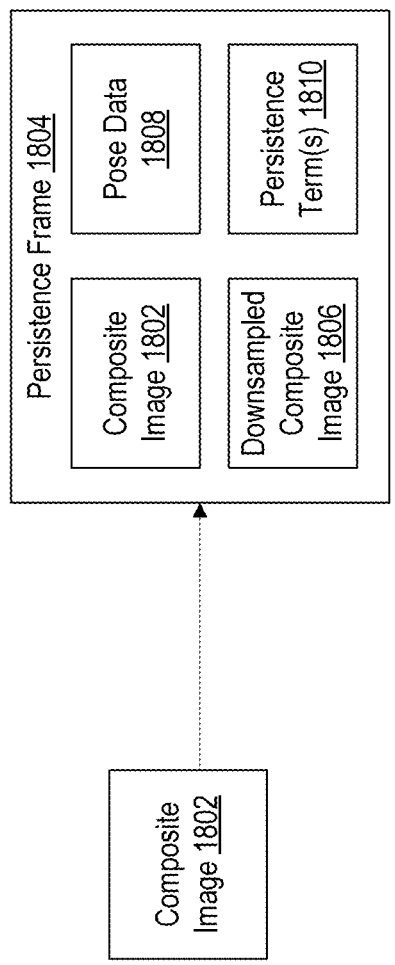
FIG. 18 illustrates a conceptual representation of generating a persistence frame based at least in part on a composite image.

FIG. 18 illustrates a conceptual representation of generating a persistence frame 1804 based at least in part on a composite image 1802. The composite image 1802 may conceptually correspond to any composite image described hereinabove (e.g., composite image 410, 514, 712, 1006, and/or 1306). For example, the composite image 1802 may be generated based on at least two image frames that are combined according to any of the techniques described hereinabove (e.g., utilizing persistence term(s) based on pose data, similarity analysis, signal strength analysis, etc.). The at least two image frames used to form the composite image 1802 may include an image frame captured using an image sensor (e.g., a SPAD sensor). In some instances, as will be described in more detail with reference to FIG. 19, at least one of the image frames used to form the composite image 1802 may itself be a preceding composite image (e.g., being formed by blending multiple image frames).

The persistence frame 1804 comprises a collection of information that may be used to form a subsequent composite image. In this regard, a persistence frame 1804 may comprise any number of components. For example, FIG. 18 shows the persistence frame 1804 as comprising the composite image 1802, thereby allowing the composite image 1802 to be used to generate a subsequent composite image. FIG. 18 also illustrates that the persistence frame 1804 may include a downsampled composite image 1806, which may comprise a downsampled version of the composite image 1802. The downsampled composite image 1806 may be generated using downsampling operations as discussed above. Maintaining a downsampled composite image 1806 via the persistence frame 1804 may facilitate similarity analysis between the composite image 1802 and a subsequently captured image frame for generating a subsequent composite image (e.g., using techniques discussed above with reference to FIGS. 8A-10).

FIG. 18 also illustrates that the persistence frame 1804 may comprise pose data 1808, which may indicate an imaging perspective associated with the composite image 1802. For example, where the composite image 1802 is based on at least one image frame captured using an image sensor, the pose data 1808 may indicate a pose that existed for the image sensor while capturing the at least one image frame (e.g., a most recently captured image frame used to form the composite image 1802). Such pose data 1808 may be used to combine the composite image 1802 with a subsequent image frame to form a subsequent composite image.

As shown in FIG. 18, the persistence frame 1804 may comprise persistence term(s) 1810. The persistence term(s) 1810 may correspond conceptually to any persistence term(s) discussed hereinabove and may include any number of components (e.g., local persistence term(s), global persistence term(s)) based on any number of persistence determinants (e.g., persistence term(s) based on pose data, persistence term(s) based on image frame similarity, persistence term(s) based on signal strength, etc.). The persistence term(s) 1810 may comprise persistence term(s) used to generate the composite image 1802 and may therefore be useful for combining the composite image 1802 with a subsequent image frame to generate a subsequent composite image.

By using a persistence frame 1804 to collect information that can be used to combine the composite image 1802 with a subsequently captured image frame to form a subsequent composite image, data that temporally precedes the composite image (e.g., previous image frames) may be omitted from memory, thereby allowing the subsequent composite image to be generated in an efficient manner.

Figure 19:
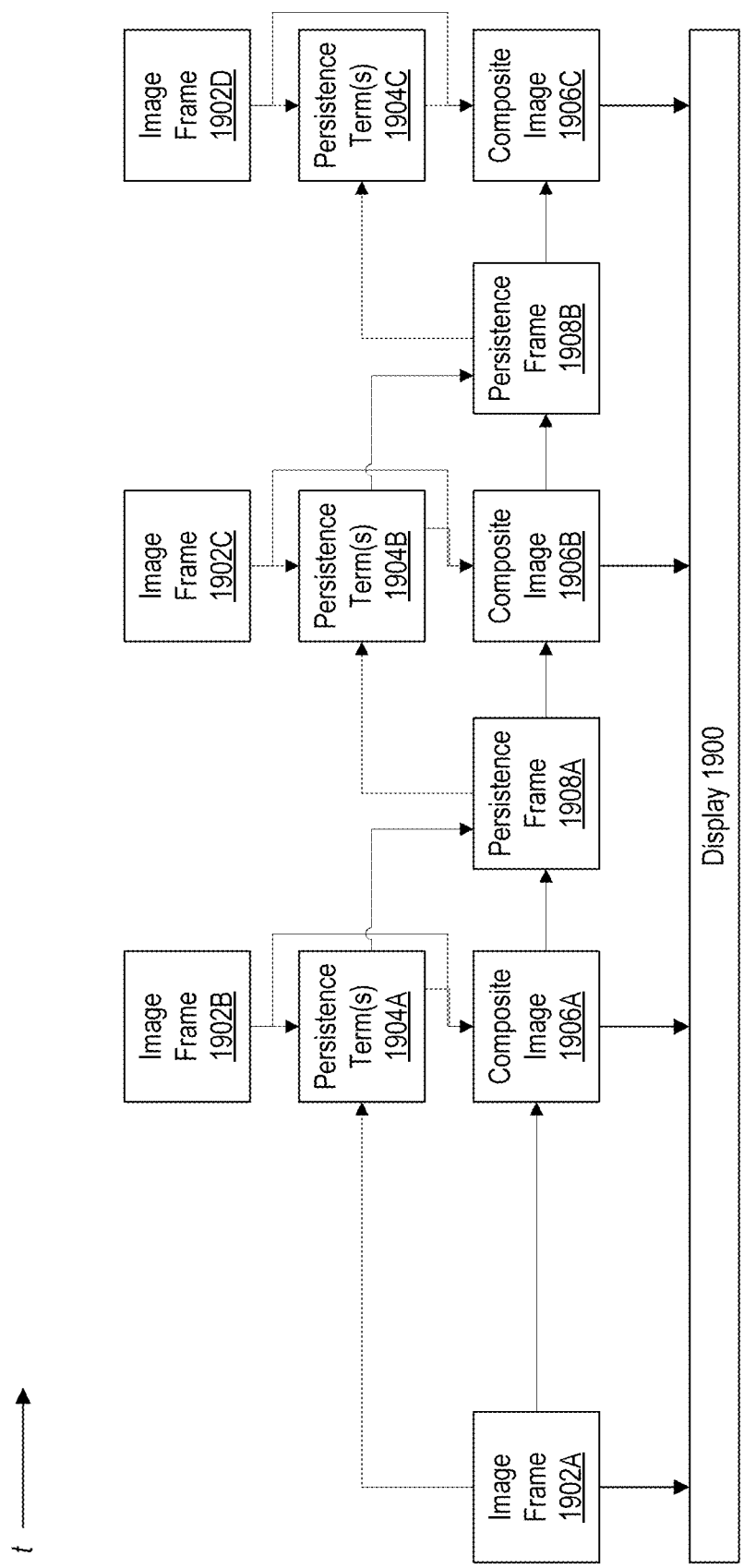
FIG. 19 illustrates a conceptual representation of generating SPAD imagery with persistence in a computationally efficient manner.

FIG. 19 illustrates a conceptual representation of generating SPAD imagery with persistence in a computationally efficient manner. FIG. 19 includes a time axis t to illustrate the temporal relationship among the various elements illustrated in FIG. 19. FIG. 19 shows an image frame 1902A. In the example shown in FIG. 19, the image frame 1902A comprises an initial image frame captured via an image sensor (e.g., a SPAD array 112 of an HMD). In some instances, the image frame 1902A, or a reprojected form of the image frame 1902A, may be shown on a display 1900 (e.g., to provide a pass-through view of an environment to a user operating an HMD).

FIG. 19 illustrates image frame 1902B captured by an image sensor temporally subsequent to the image frame 1902A. FIG. 19 additionally illustrates that persistence term(s) 1904A may be generated based on image frames 1902B and 1902A and/or information associated therewith (e.g., pose data). The persistence term(s) 1904A may then be used to combine image frame 1902A with image frame 1902B to form the composite image 1906A. The composite image 1906A, or a reprojected form of the composite image 1906A, may be shown on the display 1900 (e.g., to provide a pass-through view of an environment to a user operating an HMD).

FIG. 19 furthermore illustrates that the composite image 1906A and/or the persistence term(s) 1904A may be used to form a persistence frame 1908A. The persistence frame 1908A may correspond, in at least some respects, to the persistence frame 1804 discussed above with reference to FIG. 18. For example, the persistence frame 1908A may comprise the composite image 1906A, pose data associated therewith, a downsampled composite image, and/or persistence term(s) 1904A used to combine the image frame 1902A with the image frame 1902B to form the composite image 1906A. With the persistence frame 1908A formed, the image frame 1902A and the image frame 1902B may be omitted from memory, and the persistence frame 1908A may be used in combination with a subsequently captured image frame (e.g., image frame 1902C) to form a subsequent composite image (e.g., composite image 1906B).

As illustrated in FIG. 19, image frame 1902C may be captured by an image sensor subsequent to the capturing of the image frame 1902B. Persistence terms(s) 1904B may be generated based on the image frame 1902C and the persistence frame 1908A. For example, pose data associated with the image frame 1902C may be compared to pose data associated with the composite image 1906A (e.g., as represented in the persistence frame 1908A) to determine an amount of motion, and the amount of motion may be used to generate a persistence term for defining a contribution of the image frame 1902C and the composite image 1906A to a subsequent composite image (e.g., composite image 1906B). As another example, similarity analysis may be performed between the image frame 1902C (or a downsampled representation thereof) and the composite image 1906A (e.g., as represented in the persistence frame 1908A, or a downsampled representation of the composite image 1906A as represented in the persistence frame 1908A). The similarity analysis (e.g., regions of dissimilarity) may be used to generate a persistence term for defining a contribution of the image frame 1902C and the composite image 1906A to a subsequent composite image (e.g., composite image 1906B). As yet another example, signal strength analysis may be performed on the image frame 1902C to determine a persistence term defining a contribution of the image frame 1902C and the composite image 1906A to a subsequent composite image (e.g., composite image 1906B).

As illustrated in FIG. 19, the persistence term(s) 1904B may then be used to combine image frame 1902C with the persistence frame 1908A (or with the composite image 1906A as represented in the persistence frame 1908A) to form the composite image 1906B. The composite image 1906B, or a reprojected form of the composite image 1906B, may be displayed on the display 1900 (e.g., to provide a pass-through view of an environment to a user operating an HMD).

FIG. 19 furthermore illustrates that the composite image frame 1906B and/or the persistence term(s) 1904B may be used to form another persistence frame 1908B. With the persistence frame 1908B formed, the image frame 1902C, the composite image 1906A, and the persistence frame 1908A may be omitted from memory, and the persistence frame 1908B may be used in combination with a subsequently captured image frame (e.g., image frame 1902D) to form a subsequent composite image (e.g., composite image 1906C). For example, Persistence terms(s) 1904C may be generated based on a newly captured image frame 1902D and the persistence frame 1908B. The persistence term(s) 1904C may then be used to combine image frame 1902D with the persistence frame 1908B (or with the composite image 1906B as represented in the persistence frame 1908B) to form the composite image 1906C. The composite image 1906C, or a reprojected form of the composite image 1906C, may be displayed on the display 1900 (e.g., to provide a pass-through view of an environment to a user operating an HMD). Such processing may repeat as desired (e.g., forming another persistence frame, capturing another image, and using the persistence frame and the newly captured image to form a subsequent composite image) to facilitate computationally efficient and/or memory efficient addition of persistence to SPAD imagery.

Although the present disclosure describes various information in terms of a persistence frame, one will appreciate, in view of the present disclosure, that the present disclosure uses a persistence frame as a convenient vehicle for describing information that may be carried through from frame to frame for the generation of subsequent composite images. It will be appreciated, in view of the present disclosure, that any information described herein in association with a persistence frame may be maintained or stored in any suitable format, whether aggregated in a "persistence frame" or not.

Example Method(s) for Efficient Generation of SPAD Imagery with Persistence

FIG. 20 illustrates an example flow diagram 2000 depicting acts associated with efficient generation of SPAD imagery with persistence. The discussion of the various acts represented in the flow diagrams include references to various hardware components described in more detail with reference to FIG. 1.

Act 2002 of flow diagram 200 includes capturing, using the SPAD array, an image frame. Act 2002 is performed, in some instances, by a system utilizing processor(s) 102, storage 104, sensor(s) 110, input/output system(s) 116, communication system(s) 118, and/or other components.

Act 2004 of flow diagram 200 includes capturing, using the IMU, pose data associated with the capturing of the image frame. Act 2004 is performed, in some instances, by a system utilizing processor(s) 102, storage 104, sensor(s) 110, input/output system(s) 116, communication system(s) 118, and/or other components.

Act 2006 of flow diagram 200 includes accessing a persistence frame, the persistence frame comprising a preceding composite image frame generated based on at least one preceding image frame, the at least one preceding image frame being associated with one or more timepoints that precede a capture timepoint associated with the image frame. Act 2006 is performed, in some instances, by a system utilizing processor(s) 102, storage 104, sensor(s) 110, input/output system(s) 116, communication system(s) 118, and/or other components. In some instances, the at least preceding image frame comprises at least two preceding image frames, and the at least two image frames may comprise a prior image frame captured using the SPAD array and a preceding persistence frame associated with a timepoint that precedes a capture timepoint associated with the prior image frame. Furthermore, in some instances, the preceding persistence frame comprises a prior composite image frame generated based on one or more image frames captured using the SPAD array.

Act 2008 of flow diagram 200 includes generating a persistence term based on (i) the pose data associated with the capturing of the image frame, (ii) a similarity comparison based on the image frame and the persistence frame, or (iii) a signal strength associated with the image frame. Act 2008 is performed, in some instances, by a system utilizing processor(s) 102, storage 104, sensor(s) 110, input/output system(s) 116, communication system(s) 118, and/or other components. In some instances, the persistence term is based on pose data representing an amount of motion associated with capturing of the image frame. Furthermore, in some instances, generating the persistence term includes generating a spatially aligned image frame and a spatially aligned persistence frame by spatially aligning the persistence frame with the image frame using pose data and measuring a similarity between the spatially aligned image frame and the spatially aligned persistence frame. In response to detecting at least a region of dissimilarity between the spatially aligned image frame and the spatially aligned persistence frame, the persistence term may define a reduced contribution of the spatially aligned persistence frame to the composite image for at least the region of dissimilarity.

Furthermore, in some instances, generating the persistence term may include measuring a signal strength of at least a portion of the image frame. In response to detecting that the signal strength of at least the portion of the image frame satisfies a threshold signal strength, the persistence term may define a reduced contribution of the spatially aligned persistence frame to at least a portion of the composite image that corresponds to at least the portion of the image frame.

Act 2010 of flow diagram 200 includes generating a composite image based on the image frame, the persistence frame, and the persistence term, wherein the persistence term defines a contribution of the image frame and the persistence frame to the composite image. Act 2010 is performed, in some instances, by a system utilizing processor(s) 102, storage 104, sensor(s) 110, input/output system(s) 116, communication system(s) 118, and/or other components. In some instances, the composite image is based on a spatially aligned image frame and a spatially aligned persistence frame.

Act 2012 of flow diagram 200 includes displaying the composite image on the display. Act 2012 is performed, in some instances, by a system utilizing processor(s) 102, storage 104, sensor(s) 110, input/output system(s) 116, communication system(s) 118, and/or other components.

Act 2014 of flow diagram 200 includes capturing a subsequent image frame at a subsequent timepoint that is subsequent to the capture timepoint associated with the image frame. Act 2014 is performed, in some instances, by a system utilizing processor(s) 102, storage 104, sensor(s) 110, input/output system(s) 116, communication system(s) 118, and/or other components.

Act 2016 of flow diagram 200 includes generating a subsequent composite image using a subsequent persistence frame that is based on the composite image, the subsequent composite image being based on the subsequent persistence frame and the subsequent image frame. Act 2016 is performed, in some instances, by a system utilizing processor(s) 102, storage 104, sensor(s) 110, input/output system(s) 116, communication system(s) 118, and/or other components. In some instances, the subsequent persistence frame comprises a plurality of components. Furthermore, in some instances, components of the plurality of components of the subsequent persistence frame are associated with different persistence determinants. Also, in some implementations, components of the plurality of components of the subsequent persistence frame are associated with different image pixel regions. Still furthermore, components of the plurality of components of the subsequent persistence frame may be associated with different image frame sizes. In addition, generating the subsequent composite image may comprise generating a subsequent persistence term based on (i) pose data associated with the capturing of the subsequent image frame, (ii) a similarity comparison based on the subsequent image frame and the subsequent persistence frame, or (iii) a signal strength associated with the subsequent image frame. The subsequent persistence term defines a contribution of the subsequent image frame and the subsequent persistence frame to the subsequent composite image.

Disclosed embodiments may comprise or utilize a special purpose or general-purpose computer including computer hardware, as discussed in greater detail below. Disclosed embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are one or more "physical computer storage media" or "hardware storage device(s)." Computer-readable media that merely carry computer-executable instructions without storing the computer-executable instructions are "transmission media." Thus, by way of example and not limitation, the current embodiments can comprise at least two distinctly different kinds of computer-readable media: computer storage media and transmission media.

Computer storage media (aka "hardware storage device") are computer-readable hardware storage devices, such as RAM, ROM, EEPROM, CD-ROM, solid state drives ("SSD") that are based on RAM, Flash memory, phase-change memory ("PCM"), or other types of memory, or other optical disk storage, magnetic disk storage or other magnetic storage devices, or any other medium that can be used to store desired program code means in hardware in the form of computer-executable instructions, data, or data structures and that can be accessed by a general-purpose or special-purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmission media can include a network and/or data links which can be used to carry program code in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Disclosed embodiments may comprise or utilize cloud computing. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, wearable devices, and the like. The invention may also be practiced in distributed system environments where multiple computer systems (e.g., local and remote systems), which are linked through a network (either by hardwired data links, wireless data links, or by a combination of hardwired and wireless data links), perform tasks. In a distributed system environment, program modules may be located in local and/or remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Application-specific Standard Products (ASSPs), System-on-a-chip systems (SOCs), Complex Programmable Logic Devices (CPLDs), central processing units (CPUs), graphics processing units (GPUs), and/or others.

As used herein, the terms "executable module," "executable component," "component," "module," or "engine" can refer to hardware processing units or to software objects, routines, or methods that may be executed on one or more computer systems. The different components, modules, engines, and services described herein may be implemented as objects or processors that execute on one or more computer systems (e.g., as separate threads).

One will also appreciate how any feature or operation disclosed herein may be combined with any one or combination of the other features and operations disclosed herein. Additionally, the content or feature in any one of the figures may be combined or used in connection with any content or feature used in any of the other figures. In this regard, the content disclosed in any one figure is not mutually exclusive and instead may be combinable with the content from any of the other figures.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A system for adding persistence to single photon avalanche diode (SPAD) imagery, the system comprising:
    a SPAD array comprising a plurality of SPAD pixels;
    an inertial measurement unit (IMU) configured to capture pose data;
    one or more processors; and
    one or more hardware storage devices storing instructions that are executable by the one or more processors to configure the system to add persistence to SPAD imagery by configuring the system to:
        capture, using the SPAD array, a plurality of image frames;
        capture, using the IMU, pose data associated with the plurality of image frames, the pose data comprising at least respective pose data associated with each of the plurality of image frames;
        determine a persistence term based on the pose data, wherein the persistence term comprises a weighting term and one or more terms defining (i) alpha blending or (ii) smoothness; and
        generate a composite image based on the plurality of image frames, the respective pose data associated with each of the plurality of image frames, and the persistence term, wherein the persistence term defines a contribution of each of the plurality of image frames to the composite image.

2. The system of claim 1, wherein:
    each of the plurality of image frames is associated with a respective capture timepoint,
    the instructions are executable by the one or more processors to further configure the system to compute an amount of motion from the pose data, the amount of motion being associated with the capture of the plurality of image frames, and
    the persistence term causes the contribution to the composite image of image frames associated with earlier capture timepoints to be reduced for higher amounts of motion associated with the capture of the plurality of image frames.

3. The system of claim 1, wherein the instructions are executable by the one or more processors to further configure the system to generate a plurality of spatially aligned image frames by spatially aligning each of the plurality of image frames with one another using the respective pose data associated with each of the plurality of image frames, and wherein the composite image is based on the spatially aligned image frames.

4. The system of claim 3, wherein the instructions are executable by the one or more processors to further configure the system to:
    measure a similarity between at least a first image frame and at least a second image frame of the plurality of spatially aligned image frames, wherein the second image frame is associated with a capture timepoint that is subsequent to a capture timepoint associated with the first image frame; and
    in response to detecting at least a region of dissimilarity between the first image frame and the second image frame, modify the persistence term to cause the persistence term to define a reduced contribution of the first image frame to the composite image.

5. The system of claim 4, wherein measuring a similarity between at least the first image frame and at least the second image frame comprises:
    generating a downsampled first image frame by downsampling the first image frame;
    generating a downsampled second image frame by downsampling the second image frame; and
    measuring a similarity between the downsampled first image frame and the downsampled second image frame.

6. The system of claim 4, wherein the modified persistence term defines a reduced contribution of the first image frame to the composite image frame for the region of dissimilarity.

7. The system of claim 3, wherein the instructions are executable by the one or more processors to further configure the system to:

measure a brightness of an image frame of the plurality of spatially aligned image frames; and in response to detecting at least a region of the image frame that satisfies a threshold brightness, modify the persistence term to cause the persistence term to define a reduced contribution of one or more preceding image frames of the plurality of spatially aligned image frames to the composite image, the one or more preceding image frames being associated with one or more timepoints that precede a timepoint associated with the image frame.

8. The system of claim 7, wherein the modified persistence term defines a reduced contribution of the one or more preceding image frames to the composite image for the region of the image frame that satisfies the threshold brightness.

9. The system of claim 7, wherein the instructions are executable by the one or more processors to further configure the system to, in response to detecting at least a region of the image frame that fails to satisfy the threshold brightness, modify the persistence term to cause the persistence term to refrain from defining a reduced contribution of the one or more preceding image frames to the composite image for the region of the image frame that fails to satisfy the threshold brightness.

10. The system of claim 1, wherein the system comprises a head-mounted display (HMD).

11. The system of claim 10, wherein the system comprises a display, and wherein the instructions are executable by the one or more processors to further configure the system to display a final image on the display, the final image being based on the composite image.

12. A system for adding persistence to single photon avalanche diode (SPAD) imagery, the system comprising:
one or more processors; and
one or more hardware storage devices storing instructions that are executable by the one or more processors to configure the system to add persistence to SPAD imagery by configuring the system to:
access a plurality of sequentially captured image frames;
access pose data associated with the plurality of sequentially captured image frames, the pose data comprising at least respective pose data associated with each of the plurality of sequentially captured image frames;
generate a plurality of spatially aligned sequentially captured image frames by spatially aligning each of the plurality of sequentially captured image frames with one another using the pose data;
measure a dissimilarity between at least a first image frame and at least a second image frame of the plurality of spatially aligned sequentially captured image frames, wherein the second image frame is associated with a capture timepoint that is subsequent to a capture timepoint associated with the first image frame;
determine a persistence term based on the dissimilarity, wherein the persistence term comprises a weighting term and one or more terms defining (i) alpha blending or (ii) smoothness; and
generate a composite image based on the plurality of spatially aligned sequentially captured image frames and the persistence term, wherein the persistence term defines a contribution of each of the plurality of spatially aligned sequentially captured image frames to the composite image.

13. The system of claim 12, wherein:
the dissimilarity represents an amount of motion exhibited by an objected captured in the first image frame and in the second image frame, and
the persistence term causes the contribution to the composite image of the first image frame to be reduced for higher values of the dissimilarity.

14. The system of claim 12, wherein measuring a similarity between at least the first image frame and at least the second image frame comprises:
generating a downsampled first image frame by downsampling the first image frame;
generating a downsampled second image frame by downsampling the second image frame; and
measuring a similarity between the downsampled first image frame and the downsampled second image frame.

15. The system of claim 12, wherein measuring a similarity between at least the first image frame and at least the second image frame comprises searching for a region of dissimilarity between the first image frame and the second image frame, and wherein the instructions are executable by the one or more processors to further configure the system to, in response to identifying a region of dissimilarity between the first image frame and the second image frame, generate or modify the persistence term to define a reduced contribution of the first image frame to the composite image frame for the region of dissimilarity.

16. The system of claim 12, wherein:
the pose data represents an amount of motion associated with a capturing of the plurality of sequentially captured image frames, and
the persistence term is at least partially based on the pose data.

17. The system of claim 12, wherein the plurality of sequentially captured image frames is captured using a single photon avalanche diode (SPAD) array comprising a plurality of SPAD pixels.

18. A system for adding persistence to single photon avalanche diode (SPAD) imagery, the system comprising:
one or more processors; and
one or more hardware storage devices storing instructions that are executable by the one or more processors to configure the system to add persistence to SPAD imagery by configuring the system to:
access a plurality of sequentially captured image frames;
access pose data associated with the plurality of sequentially captured image frames, the pose data comprising at least respective pose data associated with each of the plurality of sequentially captured image frames, the pose data representing an amount of motion associated with a capturing of the plurality of sequentially captured image frames;
identify a subset of image frames from the plurality of sequentially captured image frames, wherein a quantity of image frames selected for inclusion in the subset of image frames is determined based on the amount of motion represented by the pose data, wherein the amount of motion is negatively correlated with the quantity of image frames selected for inclusion in the subset of image frames; and
generate a composite image using the subset of image frames from the plurality of sequentially captured image frames while refraining from using one or more image frames of the plurality of sequentially captured image frames that are not included in the subset of image frames.

19. The system of claim 18, wherein generating the composite image comprises spatially aligning the image frames of the subset of image frames with one another using the respective pose data associated with each image frame of the subset of image frames.

20. A system for adding persistence to single photon avalanche diode (SPAD) imagery, the system comprising:
   one or more processors; and
   one or more hardware storage devices storing instructions that are executable by the one or more processors to configure the system to add persistence to SPAD imagery by configuring the system to:
      access a plurality of sequentially captured image frames, each image frame of the plurality of sequentially captured image frames being associated with a respective capture timepoint;
      measure a brightness of at least a portion of a particular image frame of the plurality of sequentially captured image frames;
      determine a persistence term for the portion of the particular image frame based on the brightness of the portion of the particular image frame; and
      generate a composite image based on the plurality of spatially aligned sequentially captured image frames and the persistence term, wherein the persistence term defines a contribution of each of the plurality of sequentially captured image frames to the composite image.

21. The system of claim 20, wherein:
   a portion of the composite image corresponds to the portion of the particular image frame, and the persistence term causes the contribution of one or more preceding image frames to the portion of the composite image to be reduced for higher measured brightness of the portion of the particular image frame, the one or more preceding image frames being part of the plurality of sequentially captured image frames and being associated with one or more capture timepoints that precede a capture timepoint associated with the particular image frame.

* * * * *